US012660538B2

(12) United States Patent
    Chuang

(10) Patent No.:    US 12,660,538 B2
(45) Date of Patent:       Jun. 16, 2026

(54) METHOD OF MANUFACTURING SEMICONDUCTOR DEVICE FOR REDUCING DEFECT IN ARRAY REGION

(71) Applicant: NANYA TECHNOLOGY CORPORATION, New Taipei City (TW)

(72) Inventor: Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 951 days.

(21) Appl. No.: 17/853,609

(22) Filed: Jun. 29, 2022

(65) Prior Publication Data

US 2024/0006185 A1      Jan. 4, 2024

(51) Int. Cl.
    *H10P 50/28*        (2026.01)
    *H10P 50/00*        (2026.01)
    *H10P 74/20*        (2026.01)
(52) U.S. Cl.
    CPC ............ *H10P 50/283* (2026.01); *H10P 50/73* (2026.01); *H10P 74/203* (2026.01)
(58) Field of Classification Search
    CPC ......... H01L 21/31116; H01L 21/31144; H01L 22/12; H01L 21/3086; H01L 22/10; H10B 12/053; H10B 12/09
    See application file for complete search history.

(56) References Cited

U.S. PATENT DOCUMENTS

| | | | |
|---|---|---|---|
| 2004/0142503 A1 | 7/2004 | Lee et al. | |
| 2006/0234401 A1 | 10/2006 | Slisher | |
| 2007/0004152 A1* | 1/2007 | Kim ..................... | H10D 62/021 |
| | | | 257/E29.267 |
| 2009/0170326 A1 | 7/2009 | Jung | |
| 2020/0174372 A1* | 6/2020 | Hsu ......................... | G03F 7/162 |
| 2021/0373431 A1* | 12/2021 | Hsu ........................... | G03F 1/80 |
| 2022/0148909 A1 | 5/2022 | Wei et al. | |

FOREIGN PATENT DOCUMENTS

| | | | | |
|---|---|---|---|---|
| TW | 201740457 A | 11/2017 | | |
| WO | WO-2022033793 A1 * | 2/2022 | ....... | G03F 7/706837 |

* cited by examiner

*Primary Examiner* — Fernando L Toledo
*Assistant Examiner* — Jorge Andres Lopez
(74) *Attorney, Agent, or Firm* — MUNCY, GEISSLER, OLDS & LOWE, P.C.

(57)              ABSTRACT

A method of manufacturing the same is provided. The method includes providing a substrate. The method also includes forming a target layer over the substrate. The method further includes forming a patterned mask structure over the target layer. In addition, the method includes forming an etching stop layer over the patterned mask structure. The method also includes forming an underlayer over the etching stop layer; and performing an etching process to pattern the target layer.

10 Claims, 25 Drawing Sheets

Providing a substrate and forming an insulation layer and a capping layer over the substrate ~S11

Forming a target layer over the capping layer ~S12

Forming a patterned mask structure over the target layer ~S13

Forming an etching stop layer over the patterned mask and an underlayer over the etching stop layer ~S14

Performing an etching process to pattern the target layer to form a patterned target layer ~S15

Forming strips defined by the target layer ~S16

Patterning the insulation layer and the capping layer ~S17

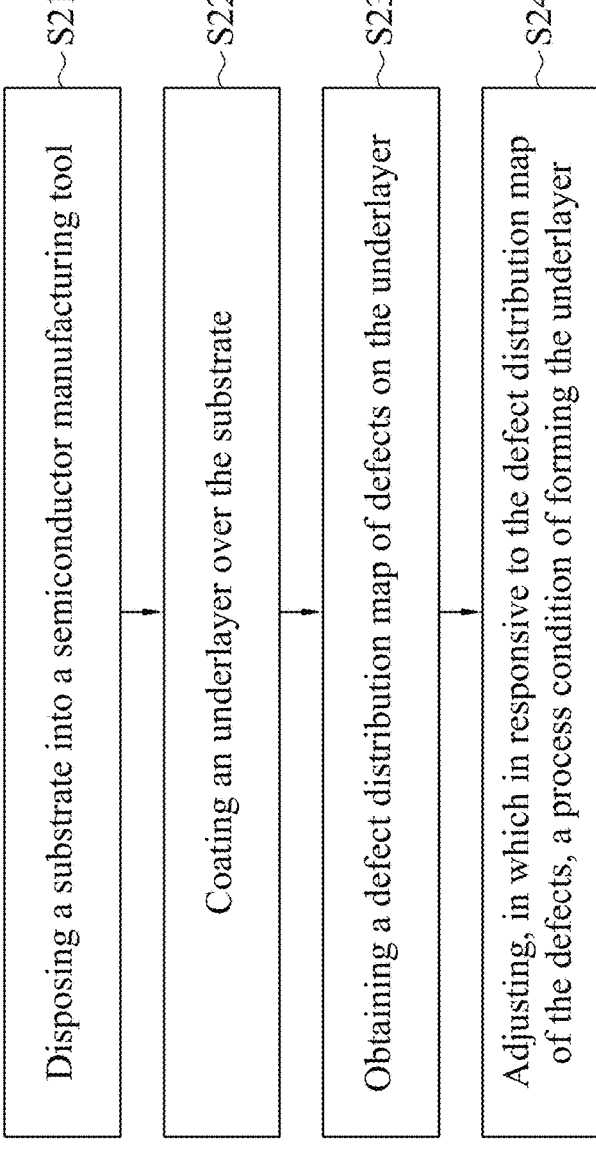
S21
Disposing a substrate into a semiconductor manufacturing tool
S22
Coating an underlayer over the substrate
S23
Obtaining a defect distribution map of defects on the underlayer
S24
Adjusting, in which in responsive to the defect distribution map of the defects, a process condition of forming the underlayer
2
FIG. 19

200

500

505

Processor
501

I/O Interface
507

UI
510

Storage Medium
503

Instructions

Program Code

Network Interface
509

Network
340

METHOD OF MANUFACTURING SEMICONDUCTOR DEVICE FOR REDUCING DEFECT IN ARRAY REGION

TECHNICAL FIELD

The present disclosure relates to a method of manufacturing a semiconductor device, and more particularly, to a method for reducing defects generated in an array region.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A memory device (e.g., dynamic random access memory (DRAM)) is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature width or critical dimension (CD). Recently, however, DRAM manufacturers face the tremendous challenge of shrinking the memory cell area as the isolation structure (such as shallow trench isolation) spacing continues to shrink. As a result of this shrinking, electrical shorts within an array region may occur which adversely affect the performance of a semiconductor device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method of manufacturing a semiconductor device. The method includes providing a substrate. The method also includes forming a target layer over the substrate. The method further includes forming a patterned mask structure over the target layer. In addition, the method includes forming an etching stop layer over the patterned mask structure. The method also includes forming an underlayer over the etching stop layer; and performing an etching process to pattern the target layer.

Another aspect of the present disclosure provides a method of manufacturing a semiconductor device. The method includes providing a substrate. The method also includes forming a target layer over the substrate. The method further includes forming a patterned mask structure over the target layer. In addition, the method includes forming an etching stop layer over the patterned mask structure. The method also includes forming an underlayer over the etching stop layer. The method further includes obtaining a defect distribution map of defects on the underlayer. In response to the defect distribution map of the defects, adjusting a process condition of forming the underlayer.

Another aspect of the present disclosure provides a method of manufacturing a semiconductor device. The method includes providing a substrate. The method also includes forming an underlayer over the substrate. The method further includes obtaining a defect distribution map of defects on the underlayer. Forming the underlayer includes disposing the substrate in a semiconductor manufacturing tool and forming the underlayer includes determining a relative position of the nozzle and the substrate based on the defect distribution map of defects on the underlayer.

The embodiments of the present disclosure provide a method of manufacturing a semiconductor device. The method includes forming an underlayer over a substrate. The method includes obtaining a defect distribution map of defects on or within the underlayer. When a density of defects within a unit area exceeding a predetermined value is detected, a process condition of an etching process or of forming the underlayer may be adjusted. As a result, the defects on or within the underlayer may be reduced, and electrical shorts within the array region may be prevented.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 1 is a flowchart illustrating a method of manufacturing a semiconductor device, in accordance with some embodiments of the present disclosure.

3

Figure 9:
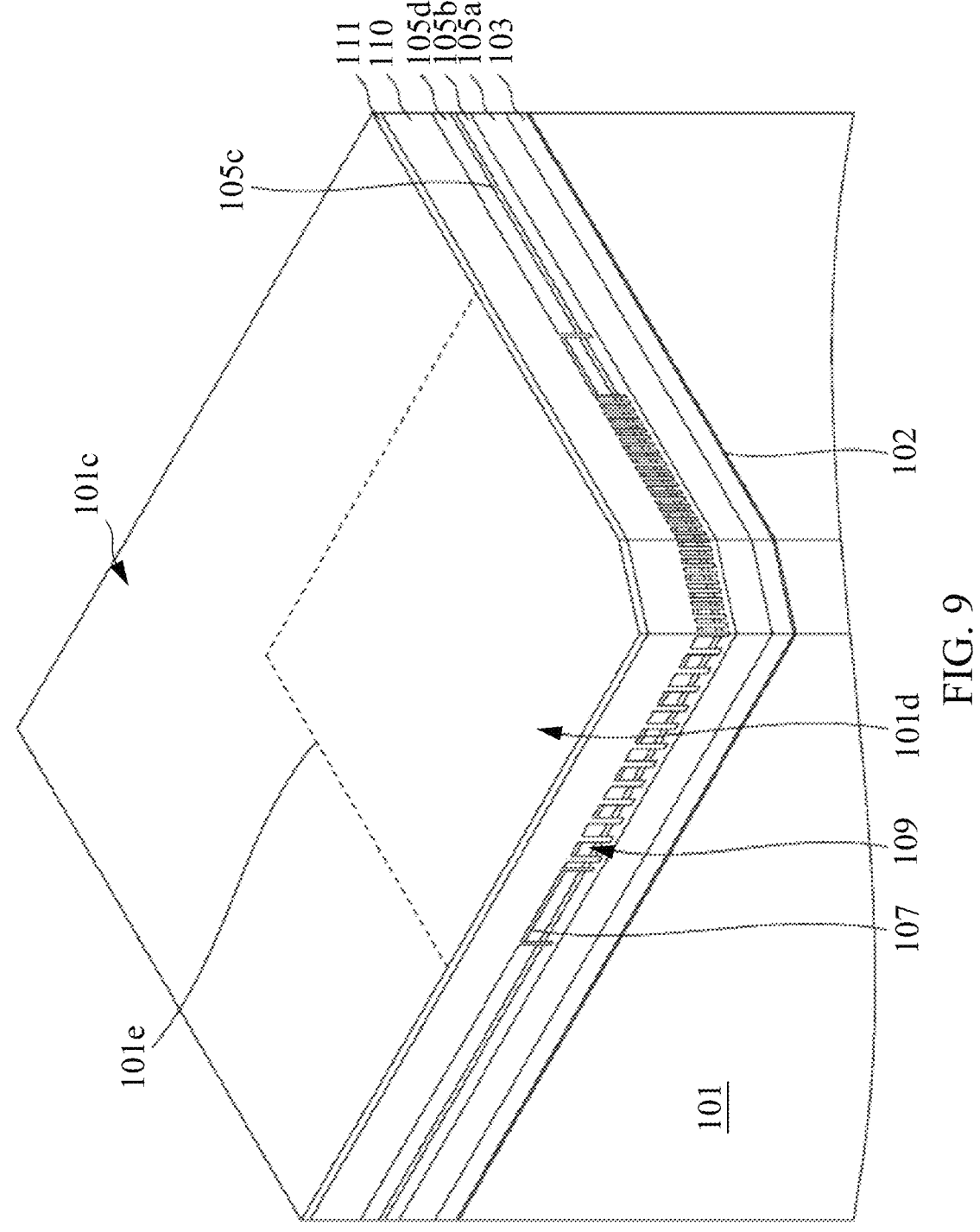

FIG. 9 illustrates one or more stages of an exemplary method for manufacturing a semiconductor device according to some embodiments of the present disclosure.

Figure 10:
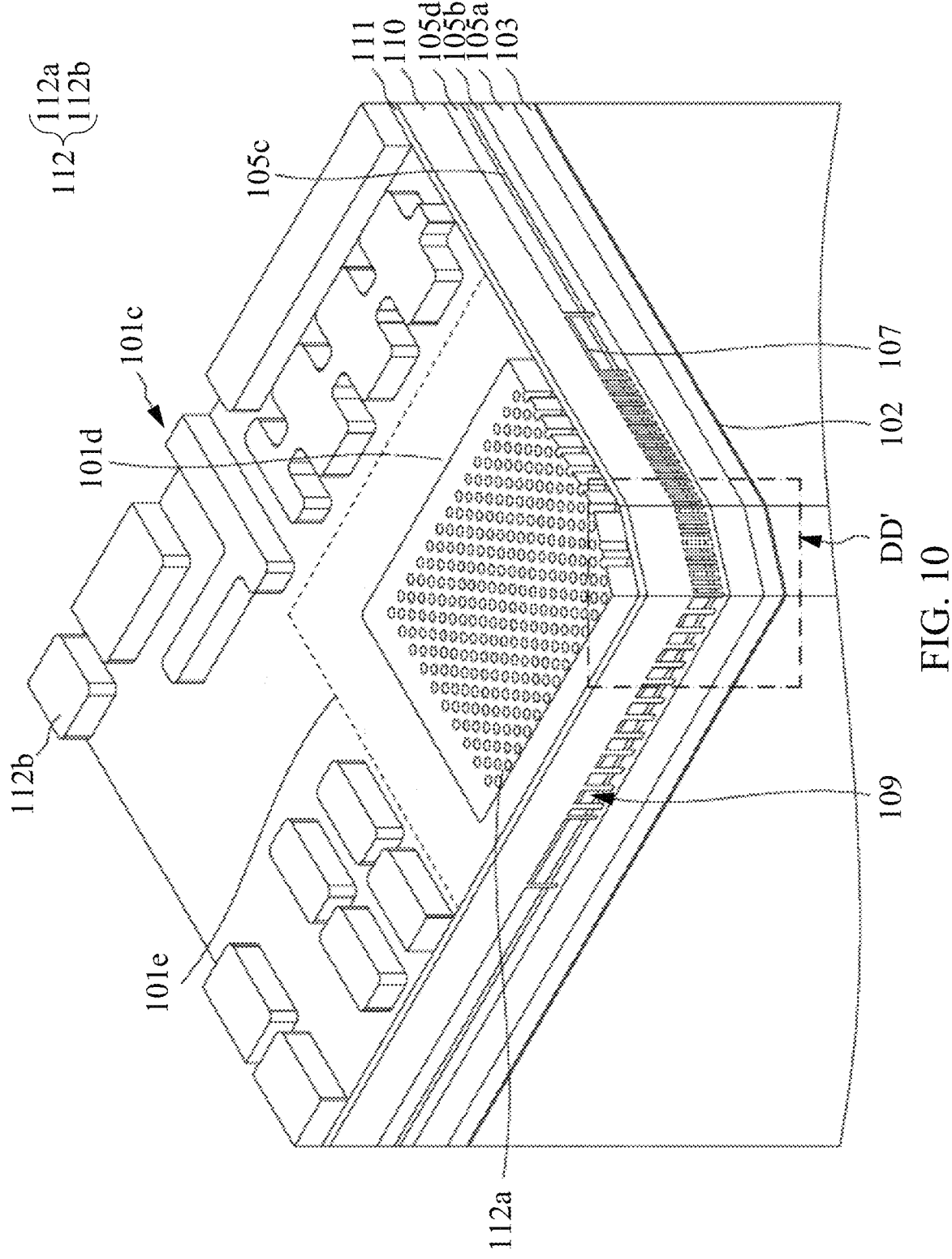

FIG. 10 illustrates one or more stages of an exemplary method for manufacturing a semiconductor device according to some embodiments of the present disclosure.

Figure 11:
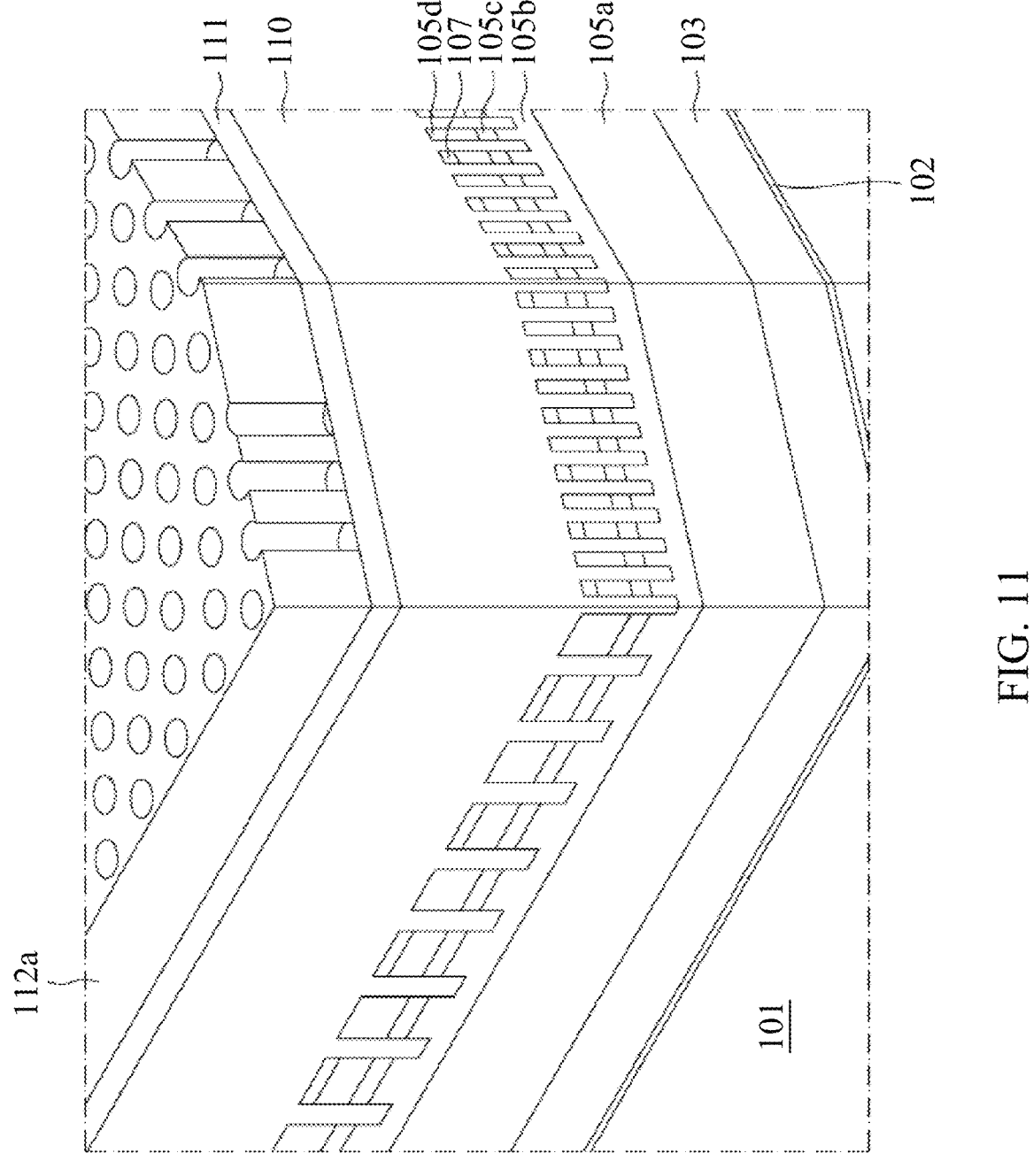

FIG. 11 is an enlarged view of a portion DD' of the semiconductor device as shown in FIG. 10.

Figure 12:
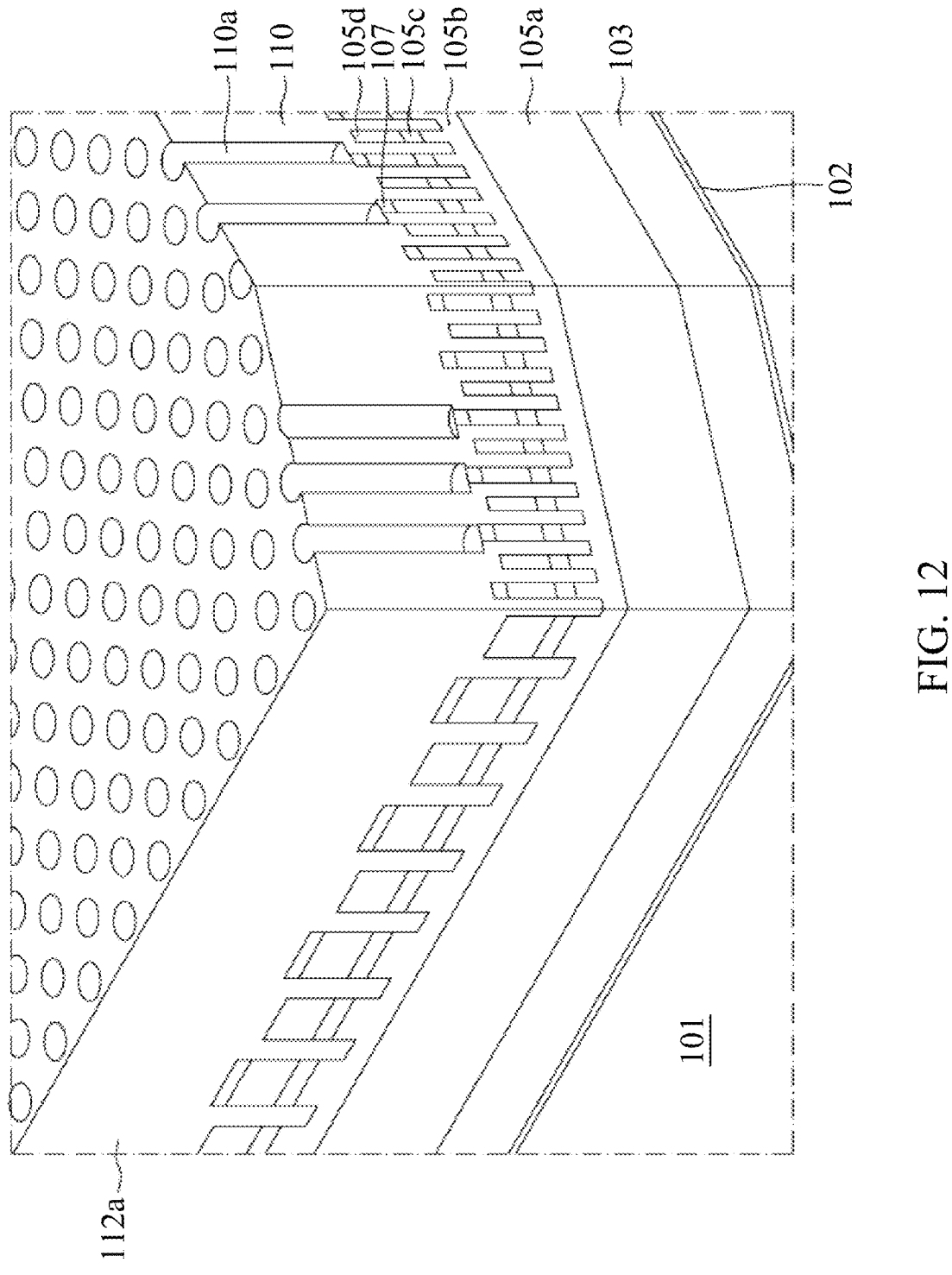

FIG. 12 illustrates one or more stages of an exemplary method for manufacturing a semiconductor device according to some embodiments of the present disclosure.

Figure 13:
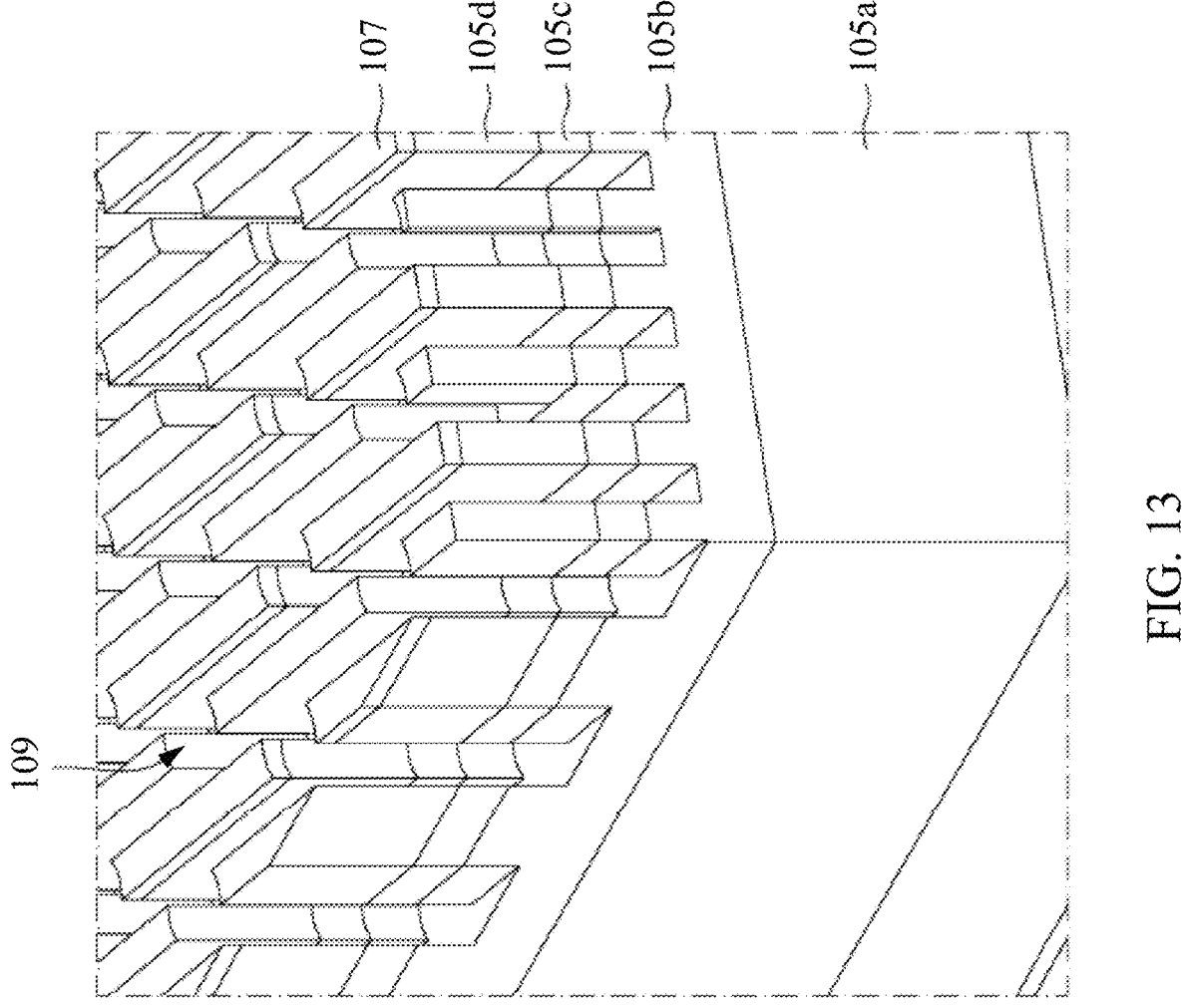

FIG. 13 illustrates one or more stages of an exemplary method for manufacturing a semiconductor device according to some embodiments of the present disclosure.

Figure 14:
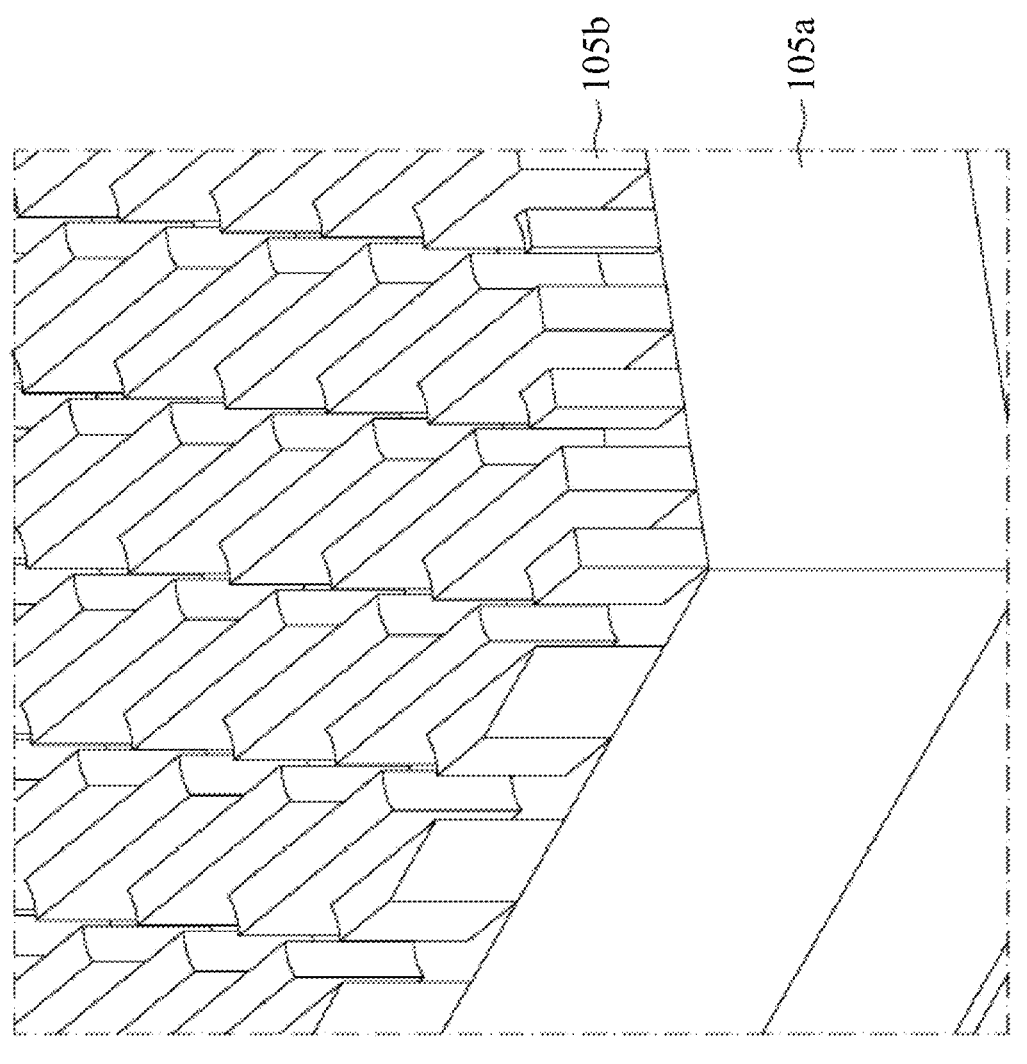

FIG. 14 illustrates one or more stages of an exemplary method for manufacturing a semiconductor device according to some embodiments of the present disclosure.

Figure 15:
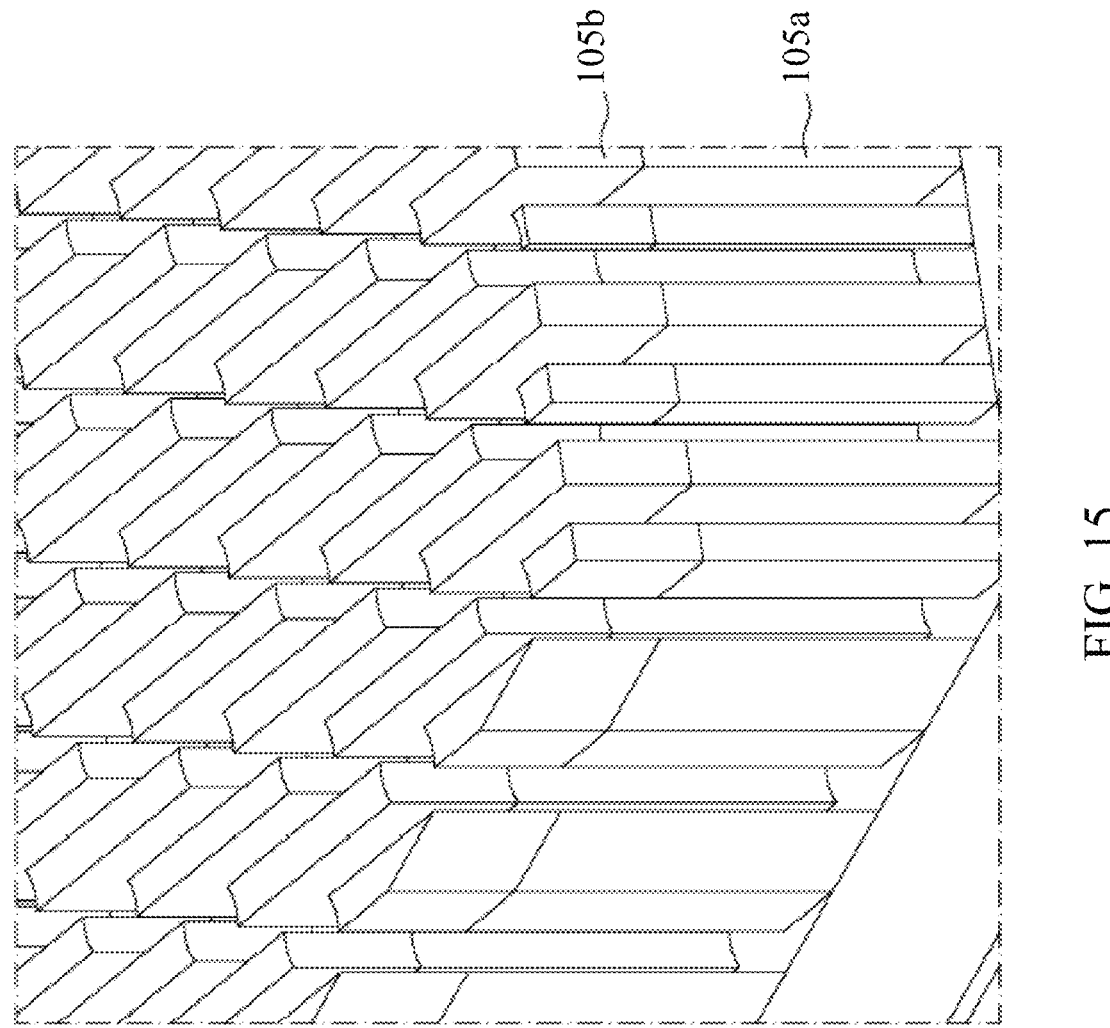

FIG. 15 illustrates one or more stages of an exemplary method for manufacturing a semiconductor device according to some embodiments of the present disclosure.

Figure 16:
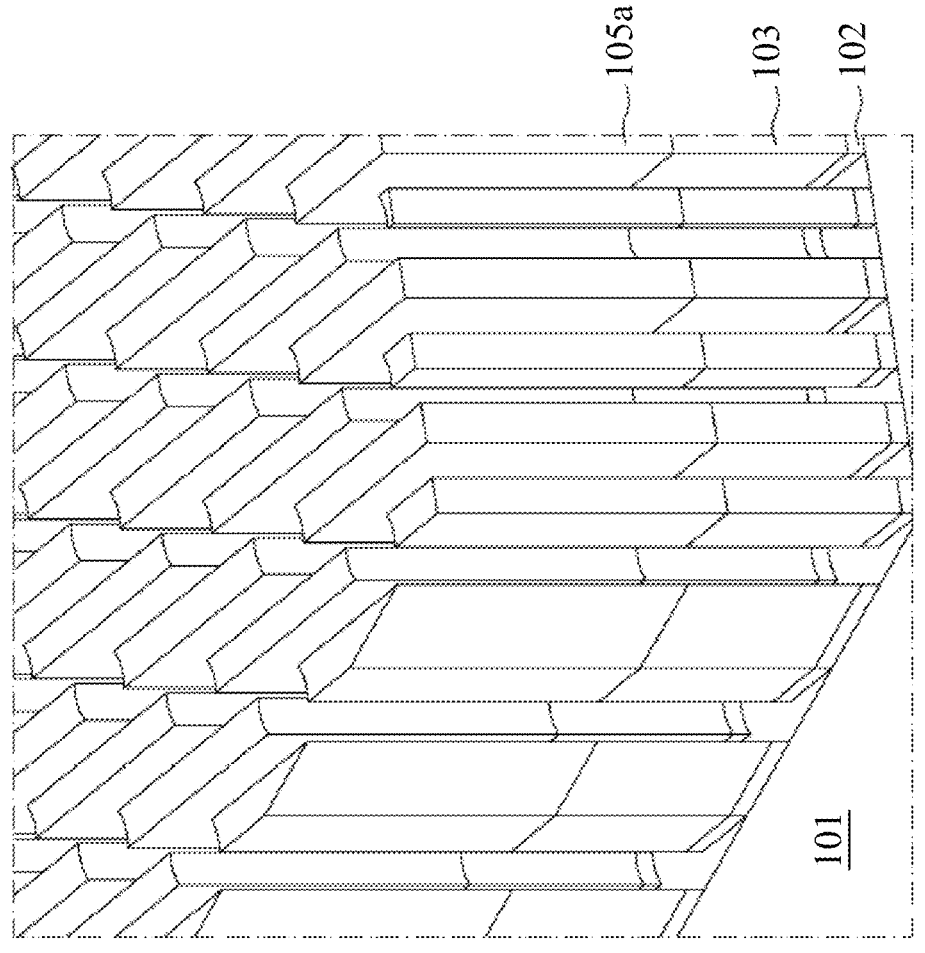

FIG. 16 illustrates one or more stages of an exemplary method for manufacturing a semiconductor device according to some embodiments of the present disclosure.

Figure 17:
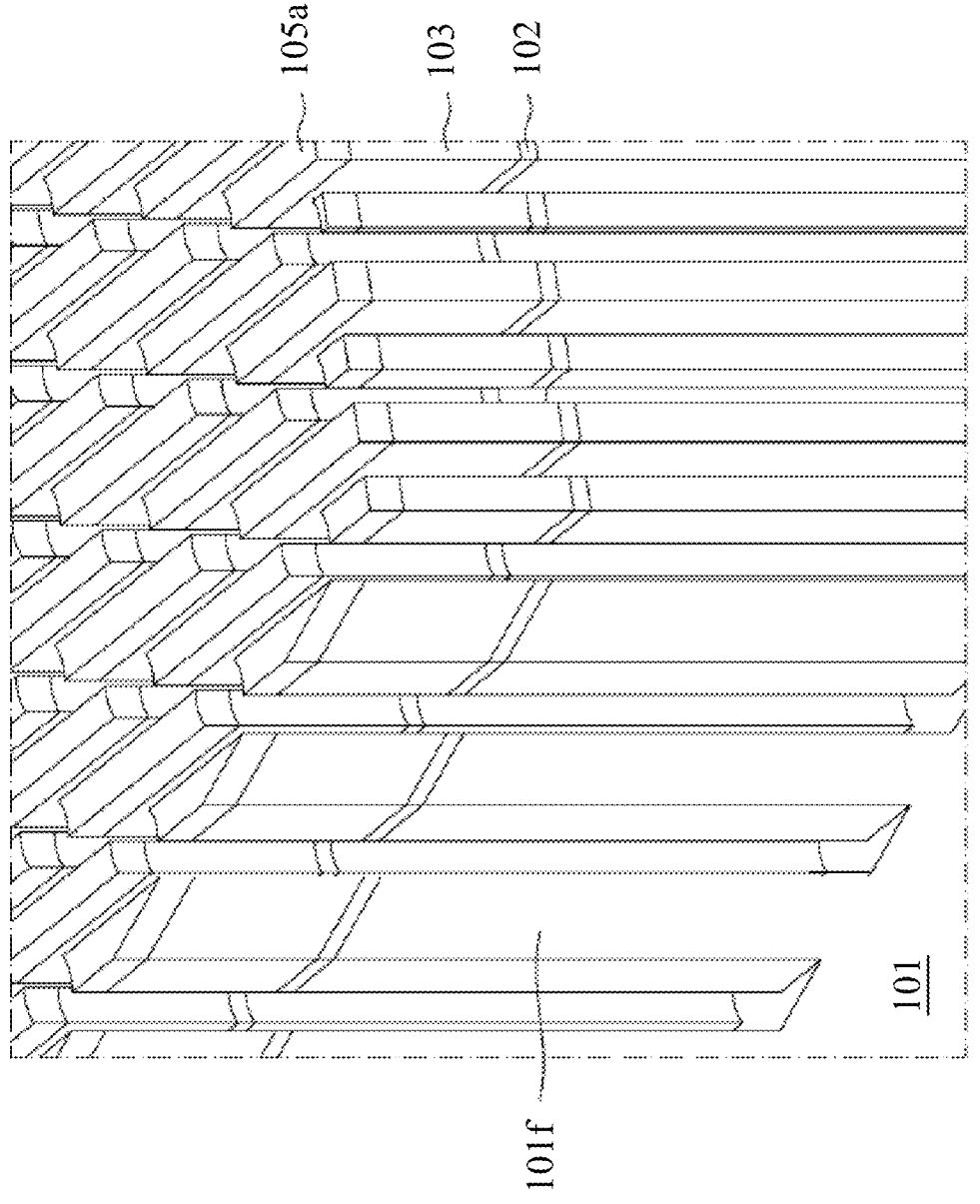

FIG. 17 illustrates one or more stages of an exemplary method for manufacturing a semiconductor device according to some embodiments of the present disclosure.

Figure 18:
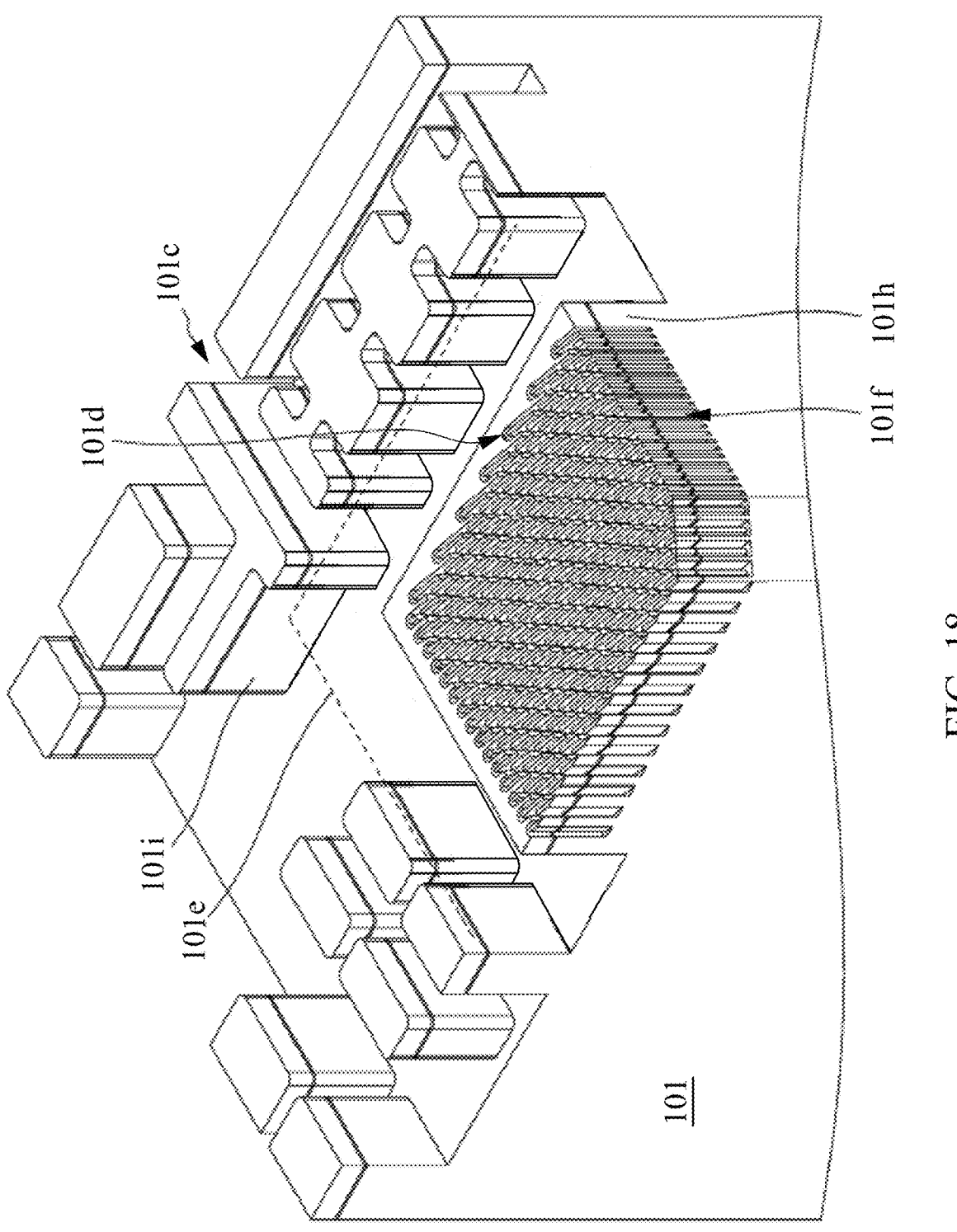

FIG. 18 illustrates one or more stages of an exemplary method for manufacturing a semiconductor device according to some embodiments of the present disclosure.

FIG. 19 is a flowchart illustrating a method of manufacturing a semiconductor device, in accordance with some embodiments of the present disclosure.

Figure 20:
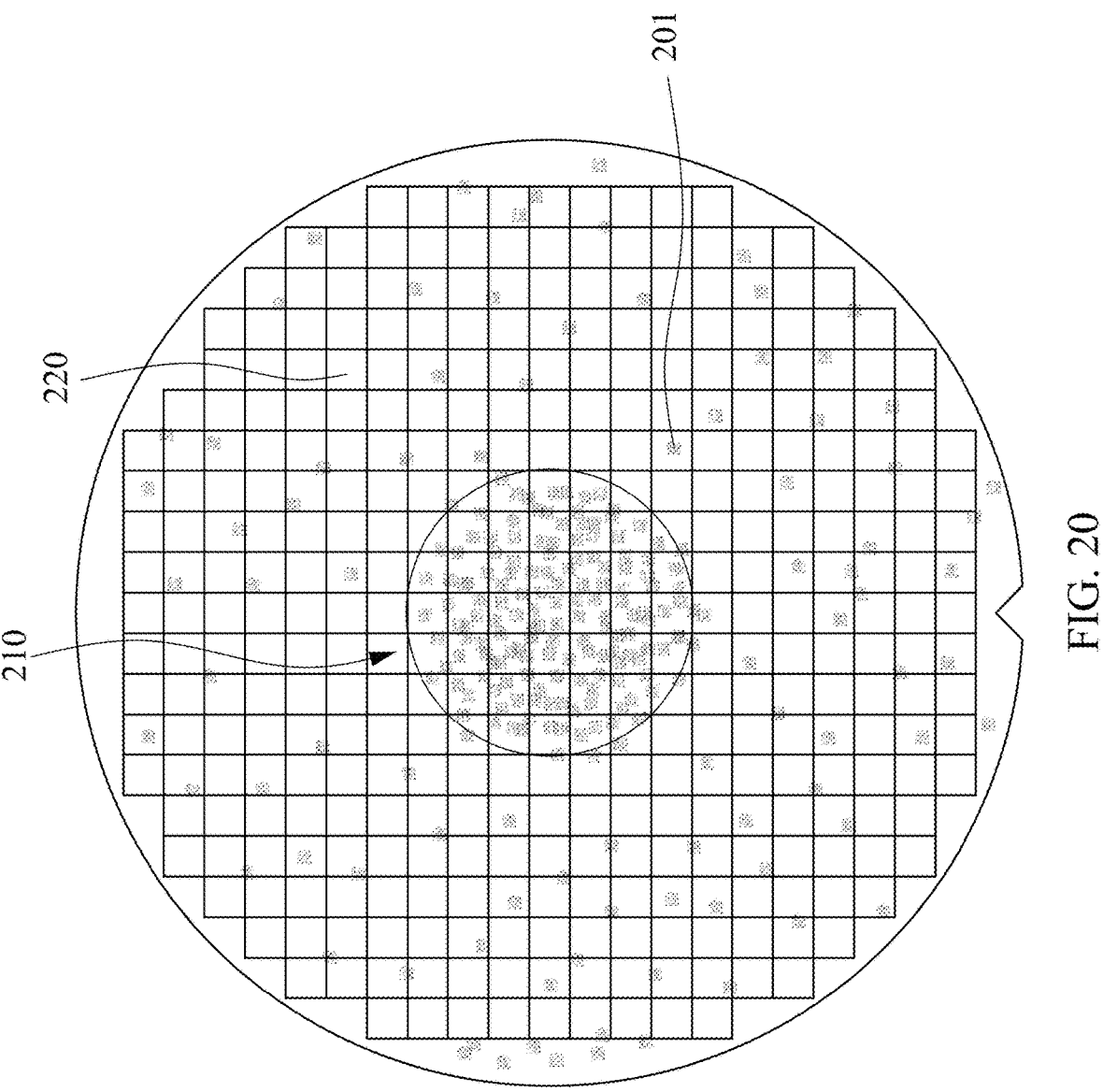

FIG. 20 is a plot illustrating a defect distribution map of defect, in accordance with one or more embodiments of the present disclosure.

Figure 21:
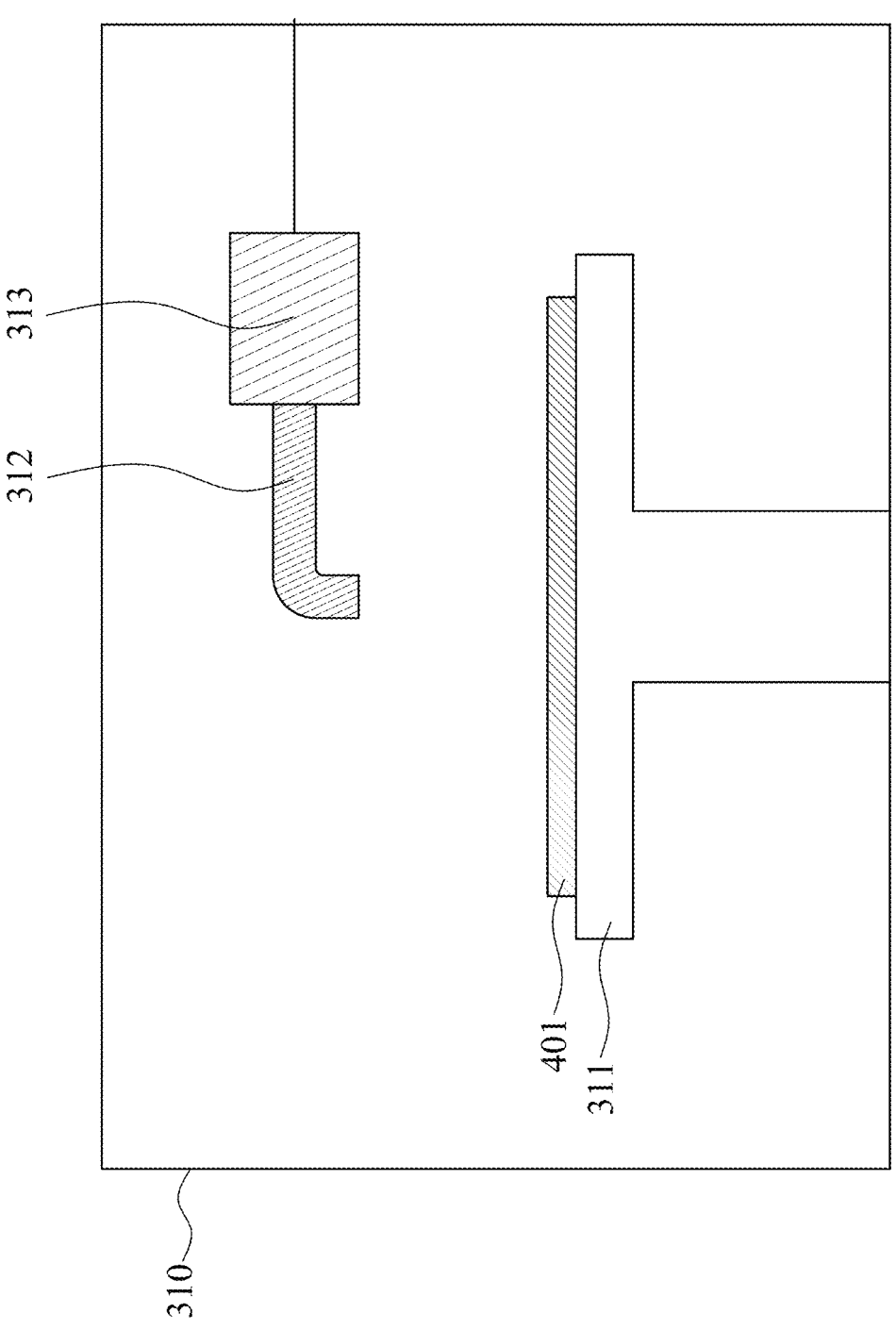

FIG. 21 illustrates one or more stages of an exemplary method for manufacturing a semiconductor device according to some embodiments of the present disclosure.

Figure 22:
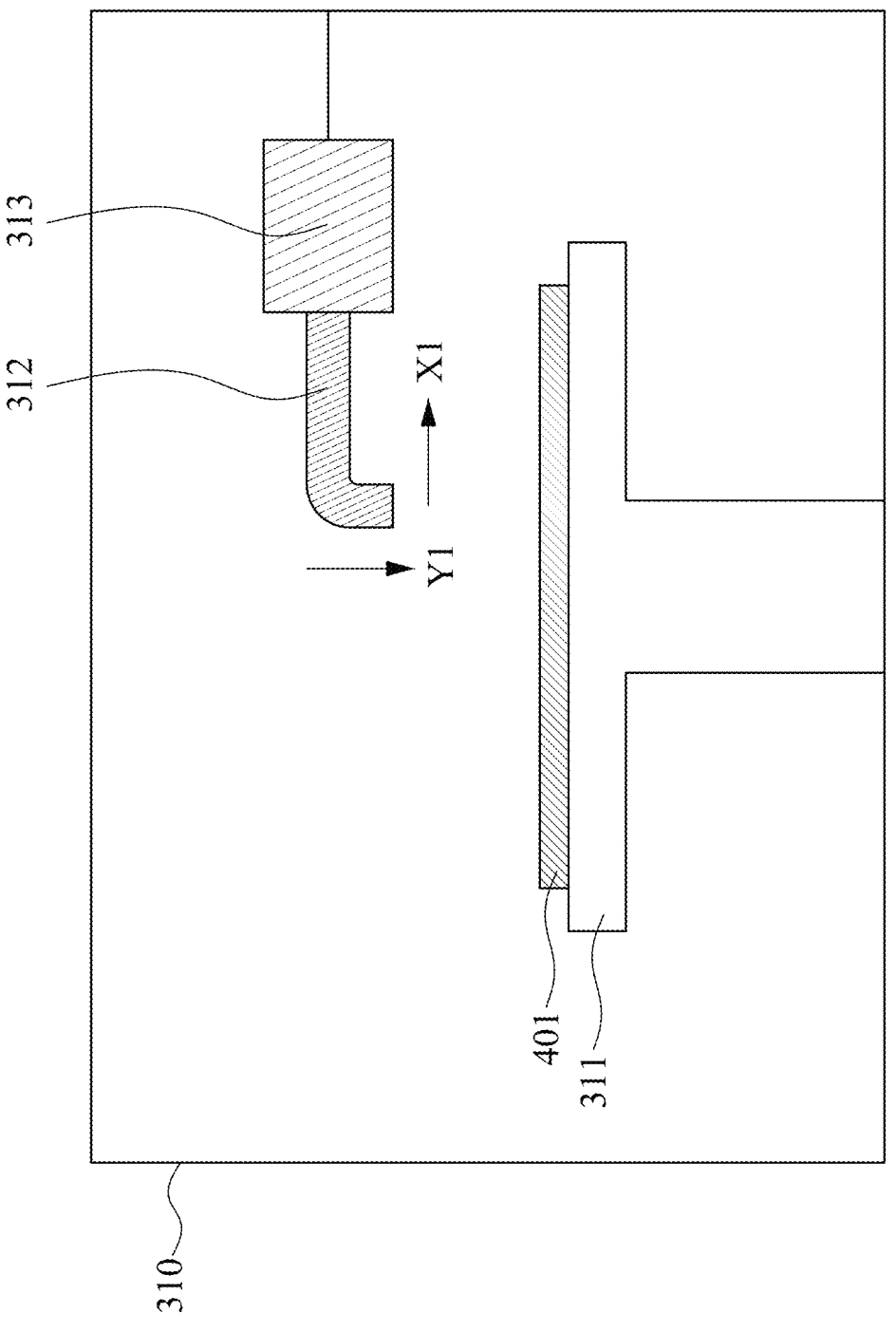

FIG. 22 illustrates one or more stages of an exemplary method for manufacturing a semiconductor device according to some embodiments of the present disclosure.

Figure 23:
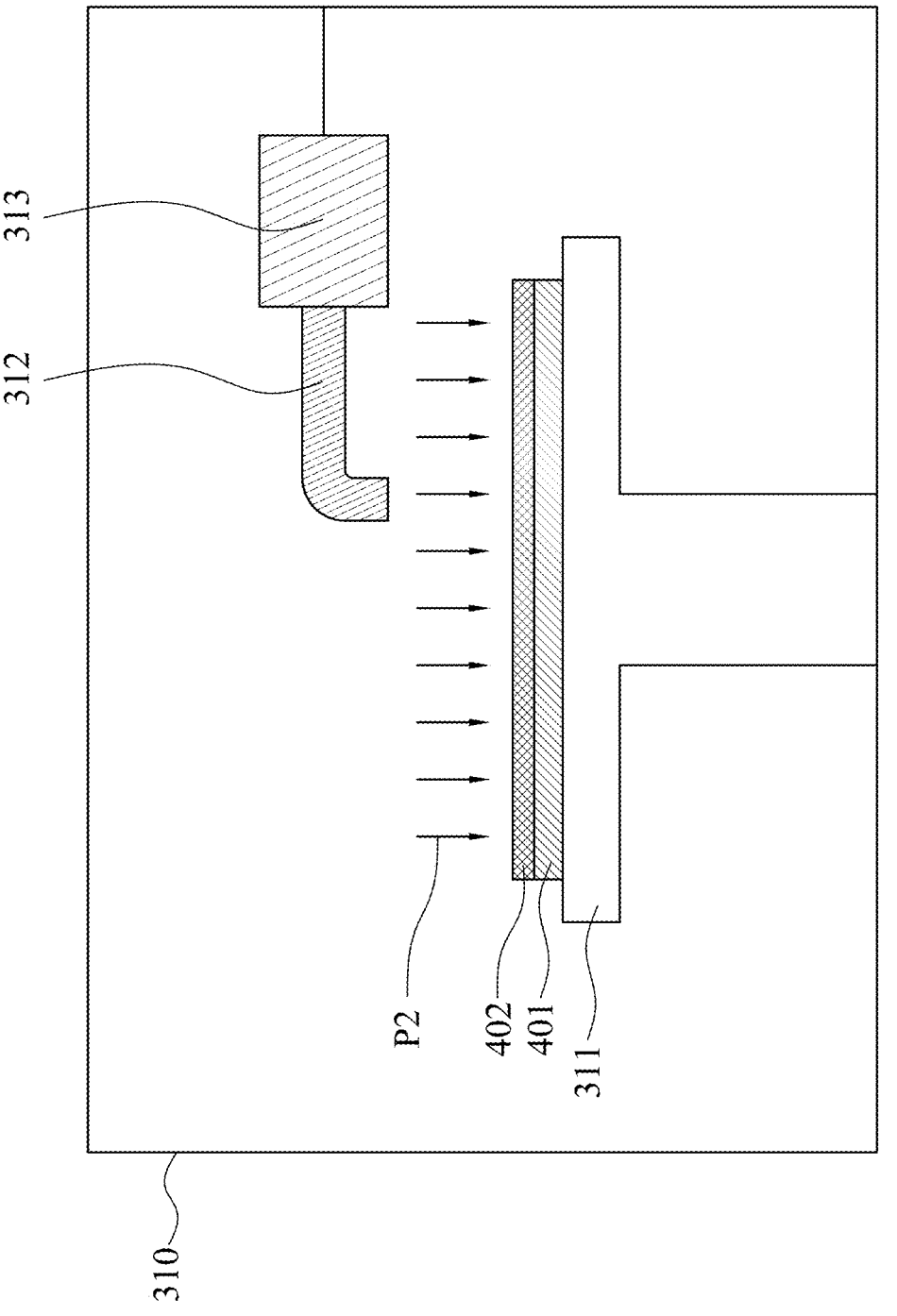

FIG. 23 illustrates one or more stages of an exemplary method for manufacturing a semiconductor device according to some embodiments of the present disclosure.

Figure 24:
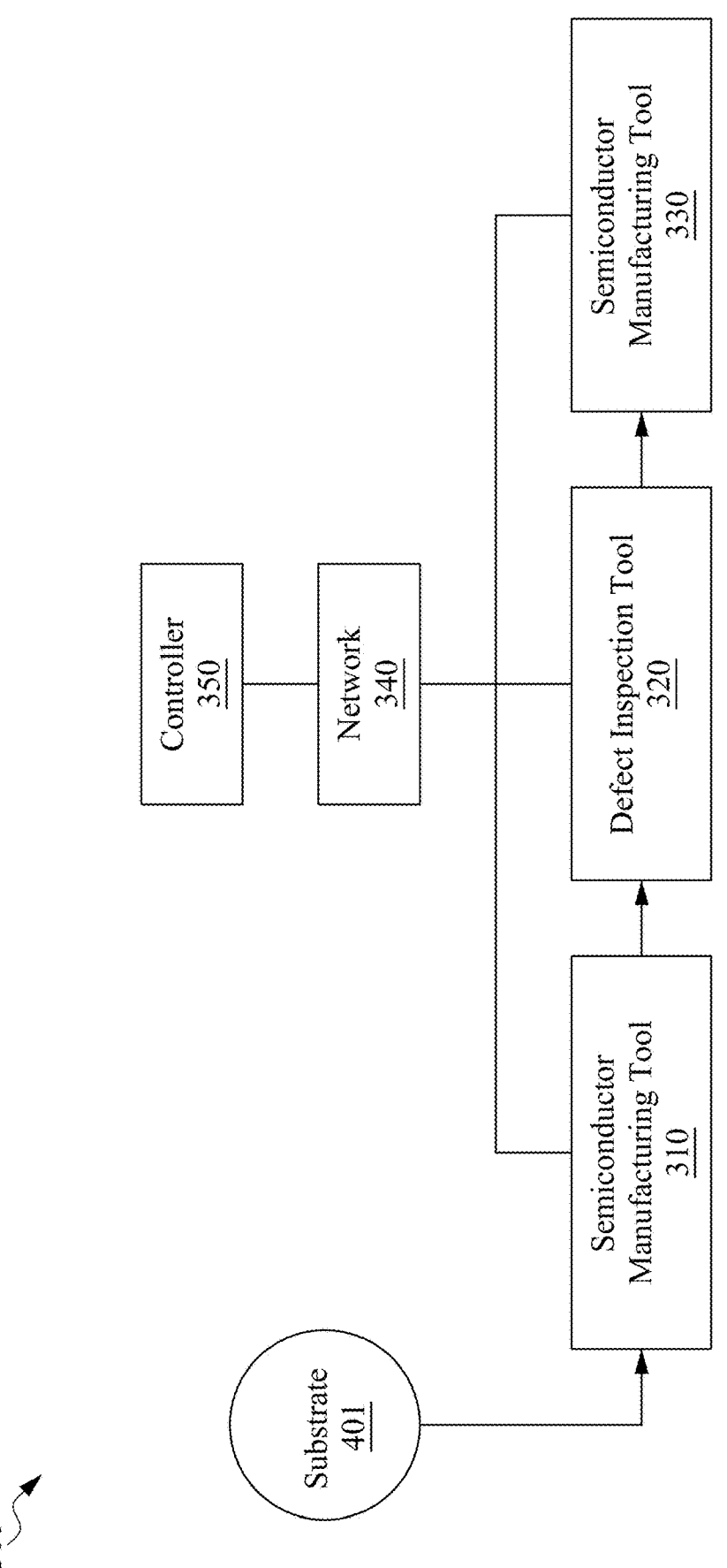

FIG. 24 is a block diagram illustrating a semiconductor fabrication system, in accordance with some embodiments of the present disclosure.

Figure 25:

FIG. 25 is a diagram illustrating hardware of a semiconductor fabrication system, in accordance with various aspects of the present disclosure.

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a flowchart of a method 1 of manufacturing a semiconductor device, in accordance with some embodiments of the present disclosure.

In some embodiments, the method 1 may begin with operation S11 in which providing a substrate and forming an insulation layer and a capping layer over the substrate.

In some embodiments, the method 1 may continue with operation S12 in which forming a target layer over the capping layer.

In some embodiments, the method 1 may continue with operation S13 in which forming a patterned mask structure over the target layer.

In some embodiments, the method 1 may continue with operation S14 in which forming an etching stop layer over the patterned mask and an underlayer over the etching stop layer.

In some embodiments, the method 1 may continue with operation S15 in which performing an etching process to pattern the target layer to form a patterned target layer.

In some embodiments, the method 1 may continue with operation S16 in which forming strips defined by the target layer.

In some embodiments, the method 1 may continue with operation S17 in which patterning the insulation layer and the capping layer.

The method 1 is merely an example, and is not intended to limit the present disclosure beyond what is explicitly recited in the claims. Additional operations can be provided before, during, or after each operation of the method 1, and some operations described can be replaced, eliminated, or reordered for additional embodiments of the method. In some embodiments, the method 1 can include further operations not depicted in FIG. 1. In some embodiments, the method 1 can include one or more operations depicted in FIG. 1.

FIG. 2 to FIG. 18 illustrate one or more stages of an exemplary method for manufacturing a semiconductor device 100 according to some embodiments of the present disclosure.

Figure 2:
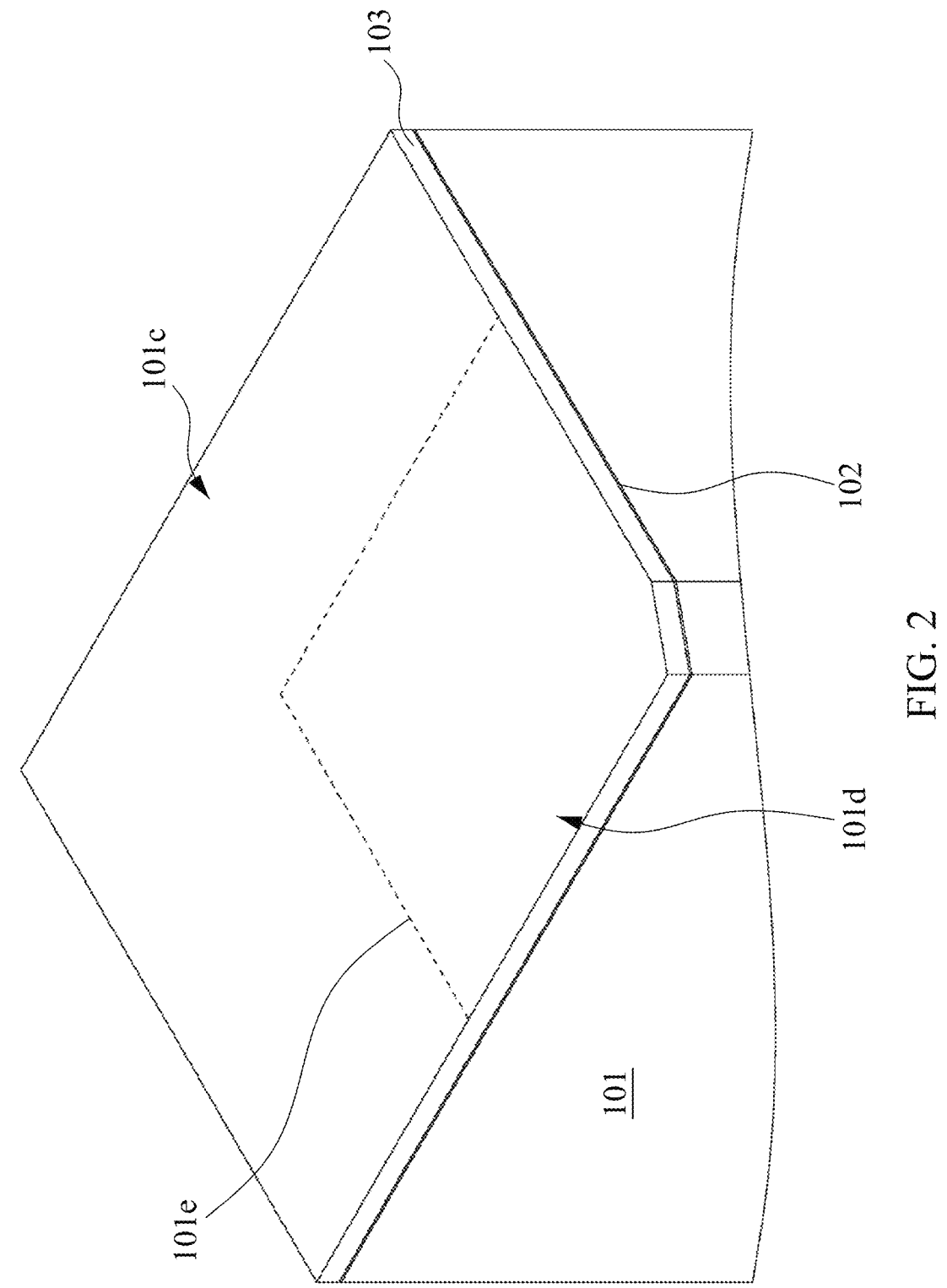
FIG. 2 illustrates one or more stages of an exemplary method for manufacturing a semiconductor device according to some embodiments of the present disclosure.

Referring to FIG. 2, a substrate 101 is provided or received. The substrate 101 may be a semiconductor substrate, such as a bulk semiconductor, a semiconductor-on-insulator (SOI) substrate, or the like. The substrate 101 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 101 may have a multilayer structure, or the substrate 101 may include a multilayer compound semiconductor structure.

In some embodiments, the substrate 101 defines a peripheral region 101c and an array region 101d at least partially surrounded by the peripheral region 101c. In some embodiments, the substrate 101 defines a boundary 101e between the peripheral region 101c and the array region 101d.

In some embodiments, the peripheral region 101c may be utilized to form a logic device. The logic device may include a system-on-a-chip (SoC), a central processing unit (CPU), a graphics processing unit (GPU), an application processor (AP), a microcontroller, a radio frequency (RF) device, a sensor device, a micro-electro-mechanical-system (MEMS) device, a digital signal processing (DSP) device, a front-end device, an analog front-end (AFE) device, or other devices.

The array region 101d may be utilized to form a memory device. The memory device can include, for example, a dynamic random access memory (DRAM) device, a one-time programming (OTP) memory device, a static random access memory (SRAM) device, or other suitable memory devices.

Referring to FIG. 2, an insulating layer 102 is formed over the substrate 101. In some embodiments, the insulating layer 120 is in contact with the substrate 101. In some embodiments, the insulating layer 102 includes oxide such as silicon oxide. In some embodiments, the insulating layer 102 is formed using a chemical vapor deposition (CVD) process, a thermal oxidation process or any other suitable process.

Referring to FIG. 2, a capping layer 103 is formed over the insulating layer 102. In some embodiments, the capping layer 103 is formed on the insulating layer 102. In some embodiments, the capping layer 103 includes nitride, such as silicon nitride. In some embodiments, the capping layer 103 may be formed using a CVD process or any other suitable process.

Figure 3:
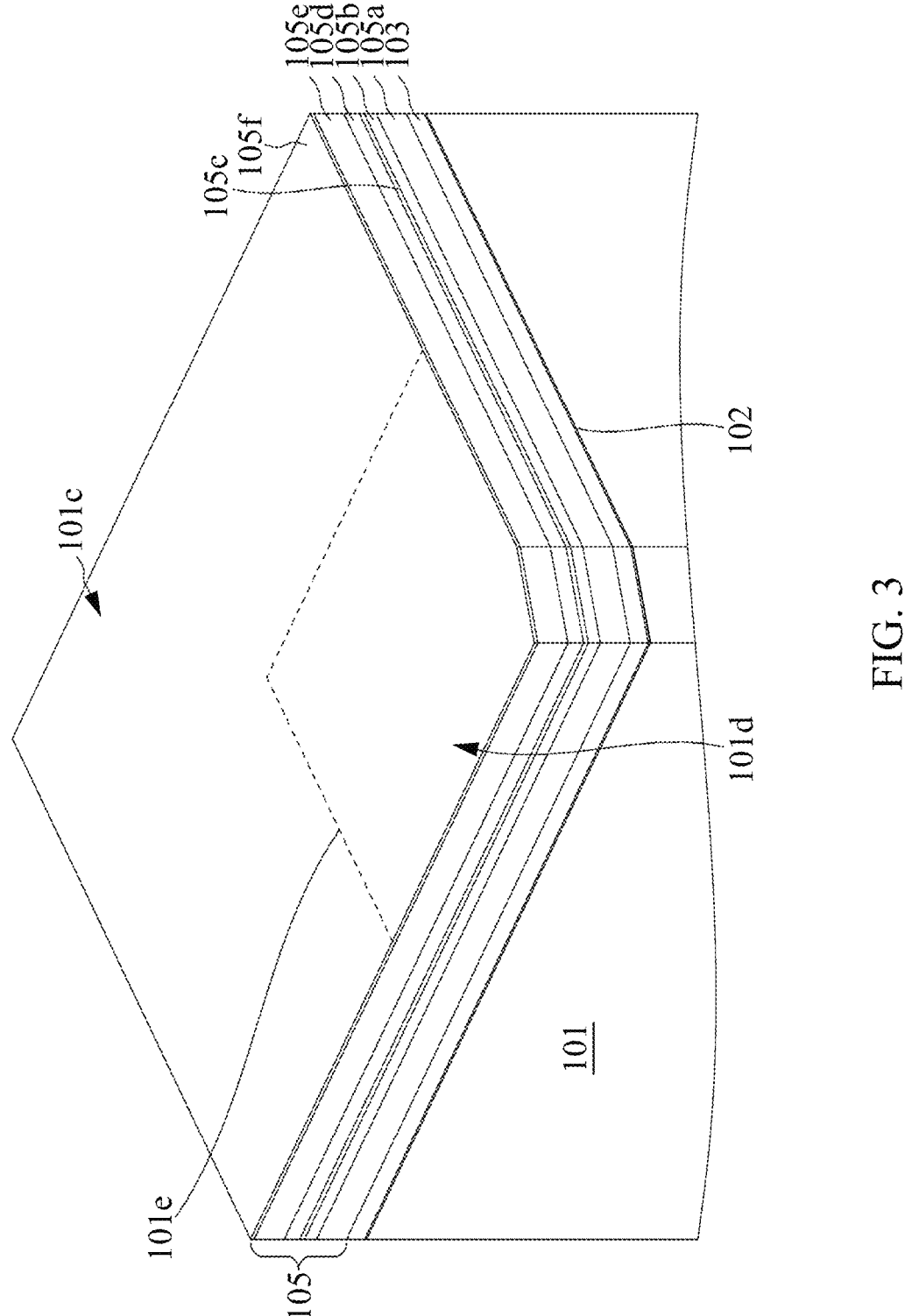
FIG. 3 illustrates one or more stages of an exemplary method for manufacturing a semiconductor device according to some embodiments of the present disclosure.

Referring to FIG. 3, a hardmask stack 105 is formed on the capping layer 103. In some embodiments, the hardmask stack 105 includes several layers stacked over each other. For example, the hardmask stack 105 may include a first layer 105a, a second layer 105b, a third layer 105c, a fourth layer 105d, a fifth layer 105e and a sixth layer 105f. In some embodiments, the first layer 105a, the second layer 105b, the third layer 105c, the fourth layer 105d, the fifth layer 105e and the sixth layer 105f are sequentially formed over the capping layer 103.

In some embodiments, the first layer 105a may be formed on the capping layer 103. In some embodiments, the first layer 105a may include carbon. In some embodiments, the first layer 105a may be formed by a CVD process or any other suitable process. In some embodiments, the second layer 105b may be formed over the first layer 105a. In some embodiments, the second layer 105b may include nitride. In some embodiments, the second layer 105b may be formed by a CVD process or any other suitable process. In some embodiments, the first layer 105a and the second layer 105b have different compositions from each other to enable selective etching of each relative to the other.

In some embodiments, the third layer 105c may be formed on the second layer 105b. In some embodiments, the third layer 105c includes polysilicon. In some embodiments, the third layer 105c is formed by a CVD process or any other suitable process. In some embodiments, the fourth layer 105d may be formed on the third layer 105c. In some embodiments, the fourth layer 105d includes oxide, such as silicon oxide. In some embodiments, the fourth layer 105d is formed by a CVD process or any other suitable process. In some embodiments, the deposition of the third layer 105c and the fourth layer 105d may be performed in-situ to save processing time and reduce possibility of contamination. As used herein, the term "in-situ" is used to refer to processes in which the substrate 101 being processed is not exposed to an external ambient (e.g., external to the processing system) environment. In some embodiments, the fourth layer 105d may also be referred to as a target layer.

In some embodiments, the fifth layer 105e may be formed on the fourth layer 105d. In some embodiments, the fifth layer 105e includes carbon. In some embodiments, the fifth layer 105e may be a sacrificial layer. In some embodiments, the fifth layer 105e may be formed using a CVD process or any other suitable process. In some embodiments, after the deposition of the fifth layer 105e, a polish process may be performed to obtain a flat surface.

In some embodiments, the sixth layer 105f may be formed on the fifth layer 105e. In some embodiments, the sixth layer 105f may include dielectric material such as nitride or oxynitride. In some embodiments, the sixth layer 105f is an antireflective coating (ARC) layer. In some embodiments, the sixth layer 105f may be formed by a plasma-enhanced CVD (PECVD) process.

Figure 4:
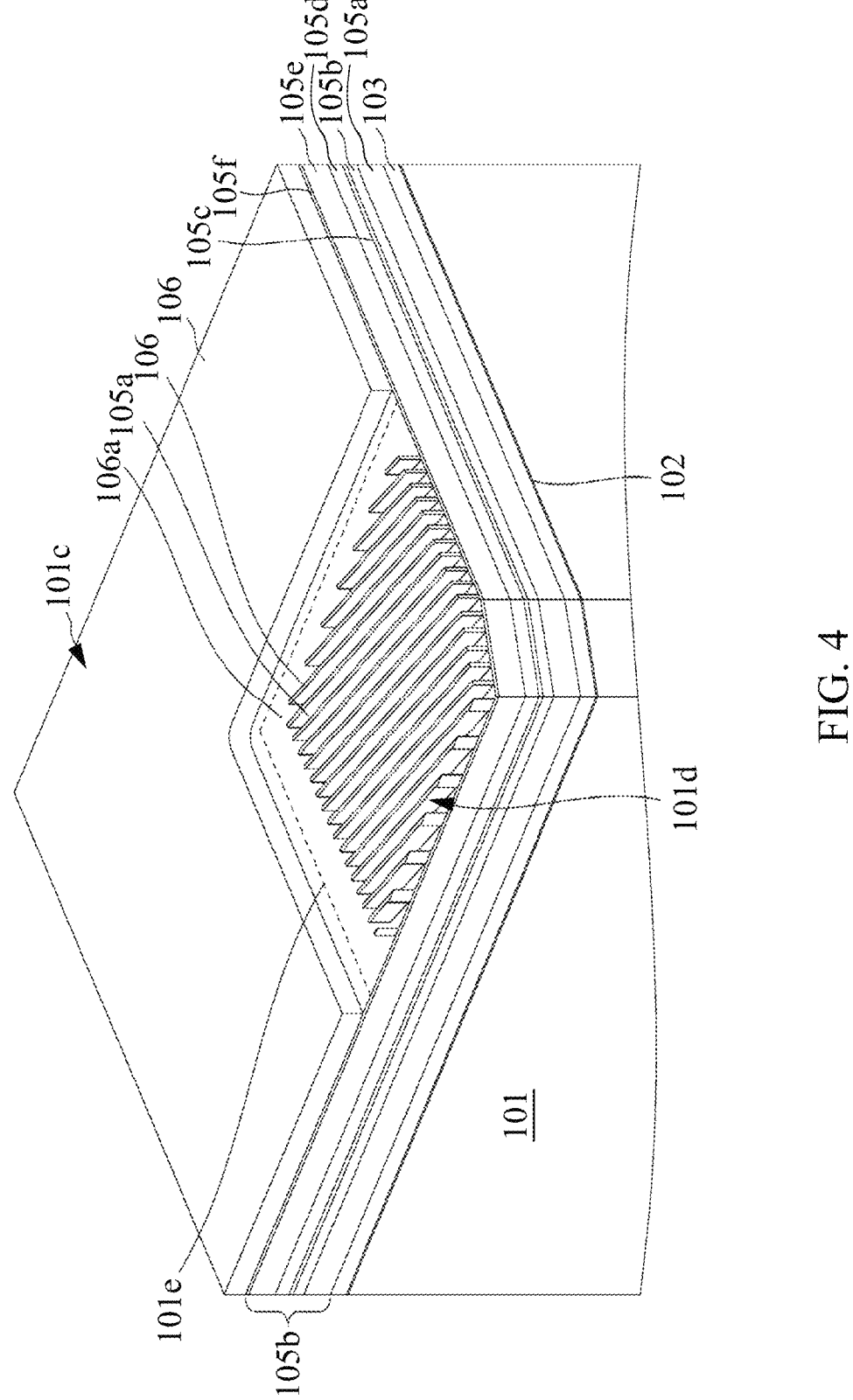
FIG. 4 illustrates one or more stages of an exemplary method for manufacturing a semiconductor device according to some embodiments of the present disclosure.

Referring to FIG. 4, a first photoresist 106 may be formed. In some embodiments, the first photoresist 106 may be formed over the hardmask stack 105. In some embodiments, the first photoresist 106 may be patterned by a photolithography process and by an etching process. The photolithography process may include photoresist coating (e.g., spin-on coating), soft baking, mask aligning, exposure, post-exposure baking, developing the photoresist, rinsing and drying (e.g., hard baking). The etching process may include, for example, dry etching, wet etching, or other suitable processes.

In some embodiments, the first photoresist 106 may include several slots 106a over the hardmask stack 105. The slots 106a may be formed over the array region 101d. In some embodiments, portions of the sixth layer 105f may be exposed through the first photoresist 106. In some embodiments, the sixth layer 105f may be formed between the fifth layer 105e and the first photoresist 106 in order to eliminate problems associated with reflection of light when exposing the first photoresist 106. In some embodiments, the sixth layer 105f may stabilize an etching selectivity of the fifth layer 105e.

Figure 5:
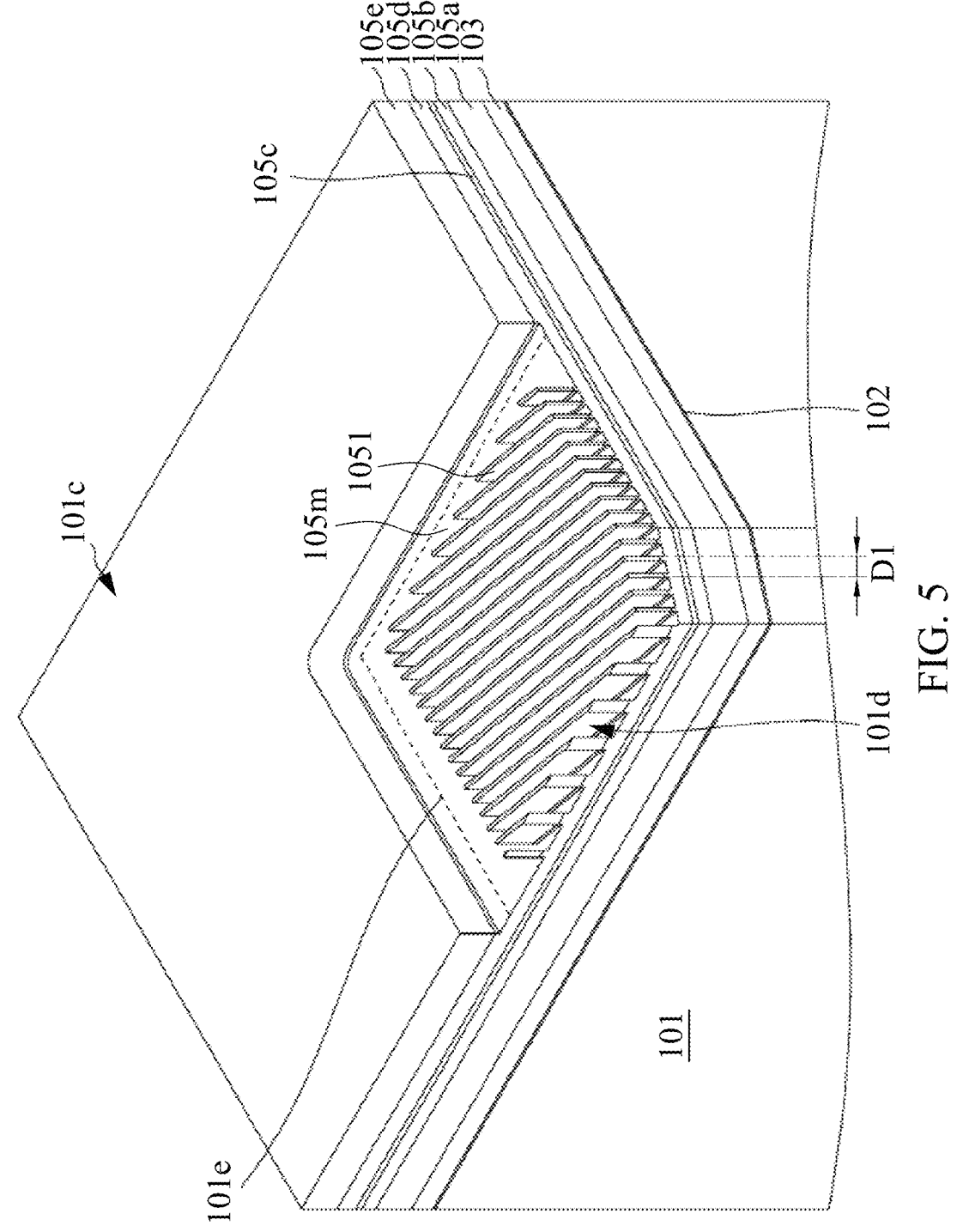
FIG. 5 illustrates one or more stages of an exemplary method for manufacturing a semiconductor device according to some embodiments of the present disclosure.

Referring to FIG. 5, the hardmask stack 105 may be patterned. In some embodiments, the hardmask stack 105 in the array region 101d of the substrate 101 may be patterned. In some embodiments, portions of the fourth layer 105d, the fifth layer 105e and the sixth layer 105f exposed through the first photoresist 106 may be removed. In some embodiments, after the removal of the portions of the fourth layer 105d, the fifth layer 105e and the sixth layer 105f exposed through the first photoresist 106, the first photoresist 106 and the remaining portion of the sixth layer 105f are removed. In some embodiments, a patterned mask structure 105m may be formed. In some embodiments, the patterned mask structure 105m may include a plurality of islands 105l. In some embodiments, each of the islands may include the fifth layer 105e and a portion of the fourth layer 105d. The patterned mask structure 105m may have a pitch D1 defined by a distance between two islands 105l.

Figure 6:
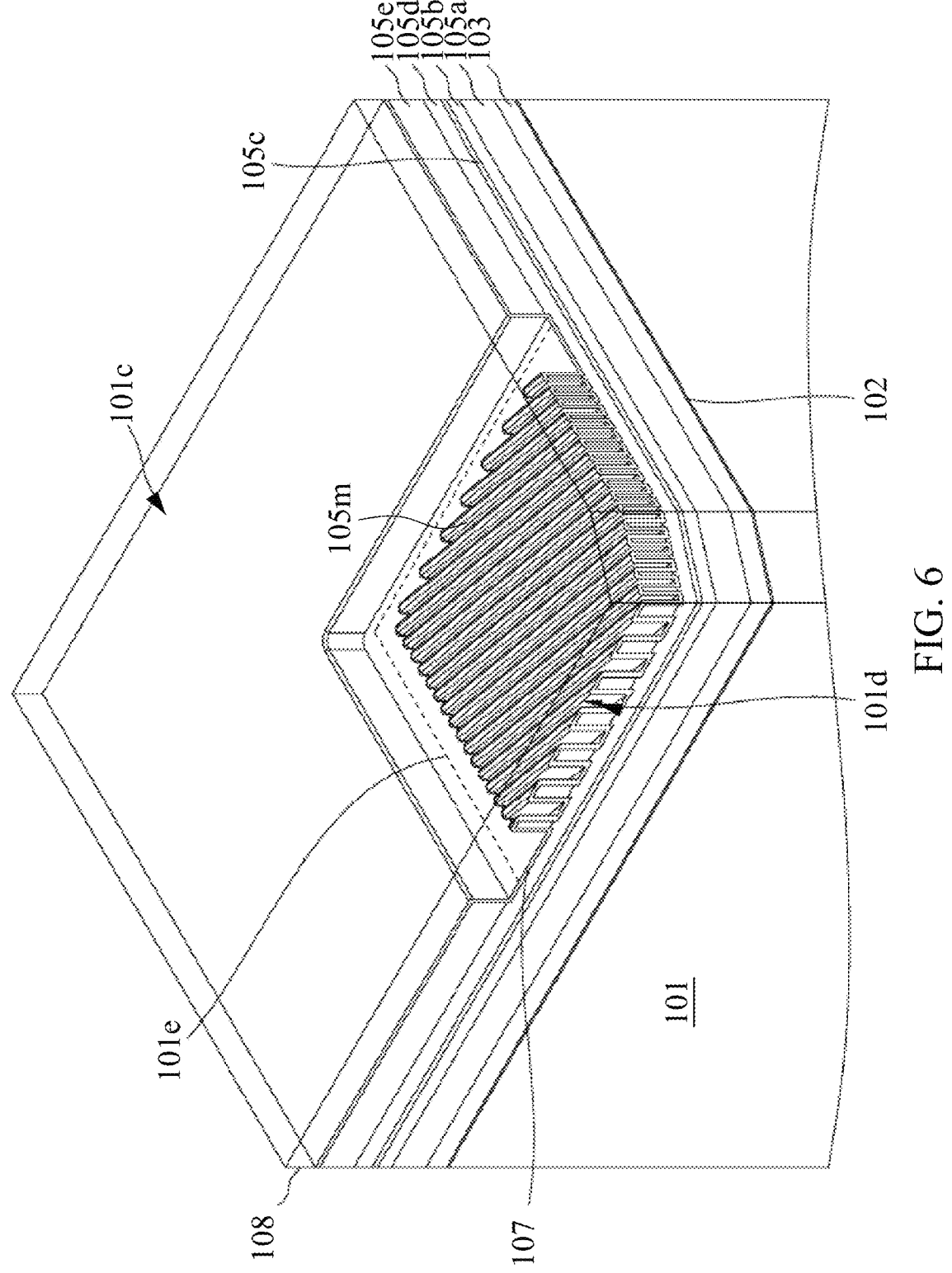
FIG. 6 illustrates one or more stages of an exemplary method for manufacturing a semiconductor device according to some embodiments of the present disclosure.

Referring to FIG. 6, an etching stop layer 107 may be formed on the fifth layer 105e. In some embodiments, the etching stop layer 107 may be conformally formed on the patterned mask structure 105m. In some embodiments, the etching stop layer 107 may be conformally formed on the islands 105l. In some embodiments, the etching stop layer may include, for example, silicon oxide. In some embodiments, an underlayer 108 may be formed over the etching stop layer 107. In some embodiments, the underlayer 108 may include an antireflective coating (ARC) or other suitable materials. The underlayer 108 may be formed by, for example, a coating process.

Figure 7:
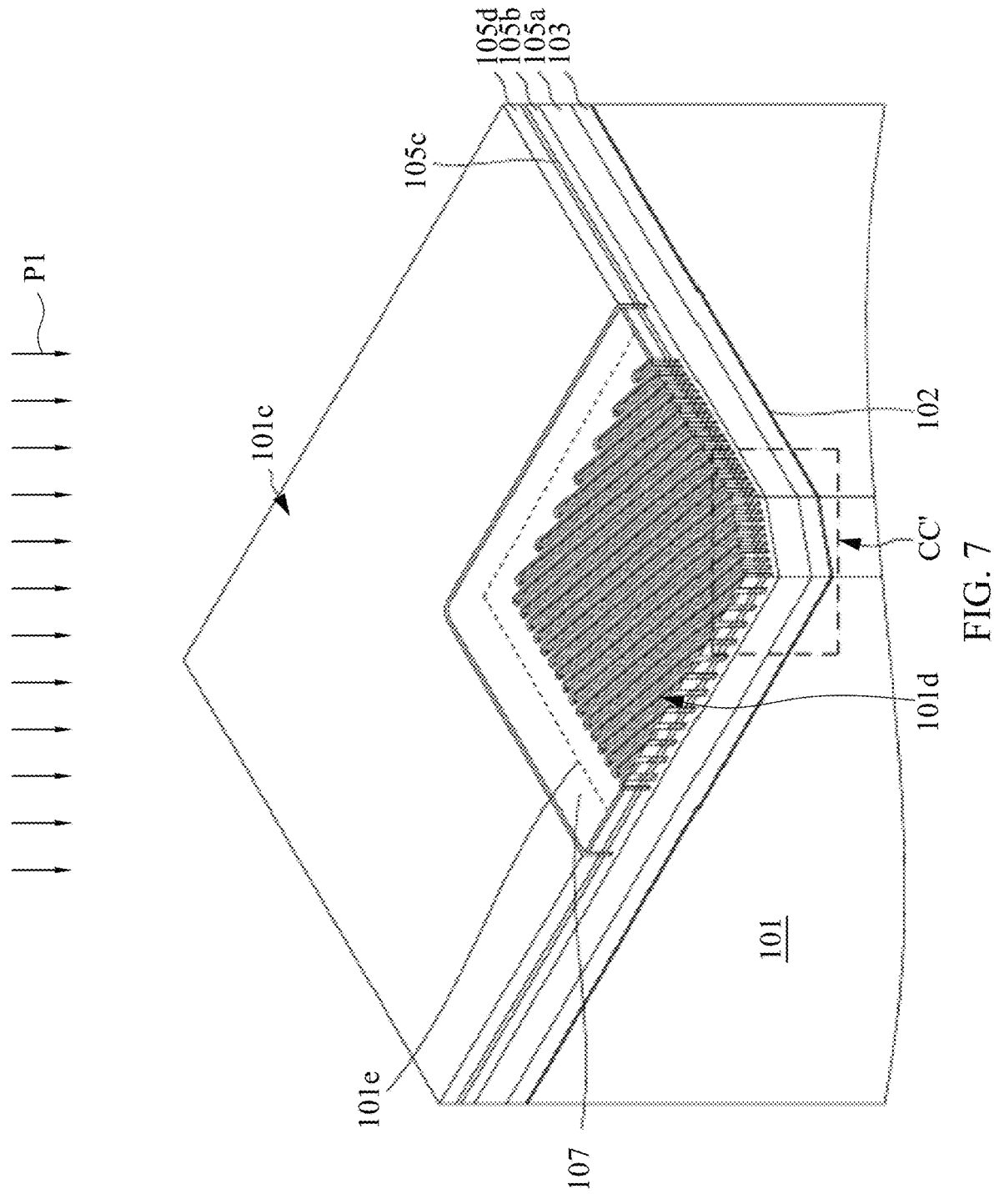
FIG. 7 illustrates one or more stages of an exemplary method for manufacturing a semiconductor device according to some embodiments of the present disclosure.
Figure 8:
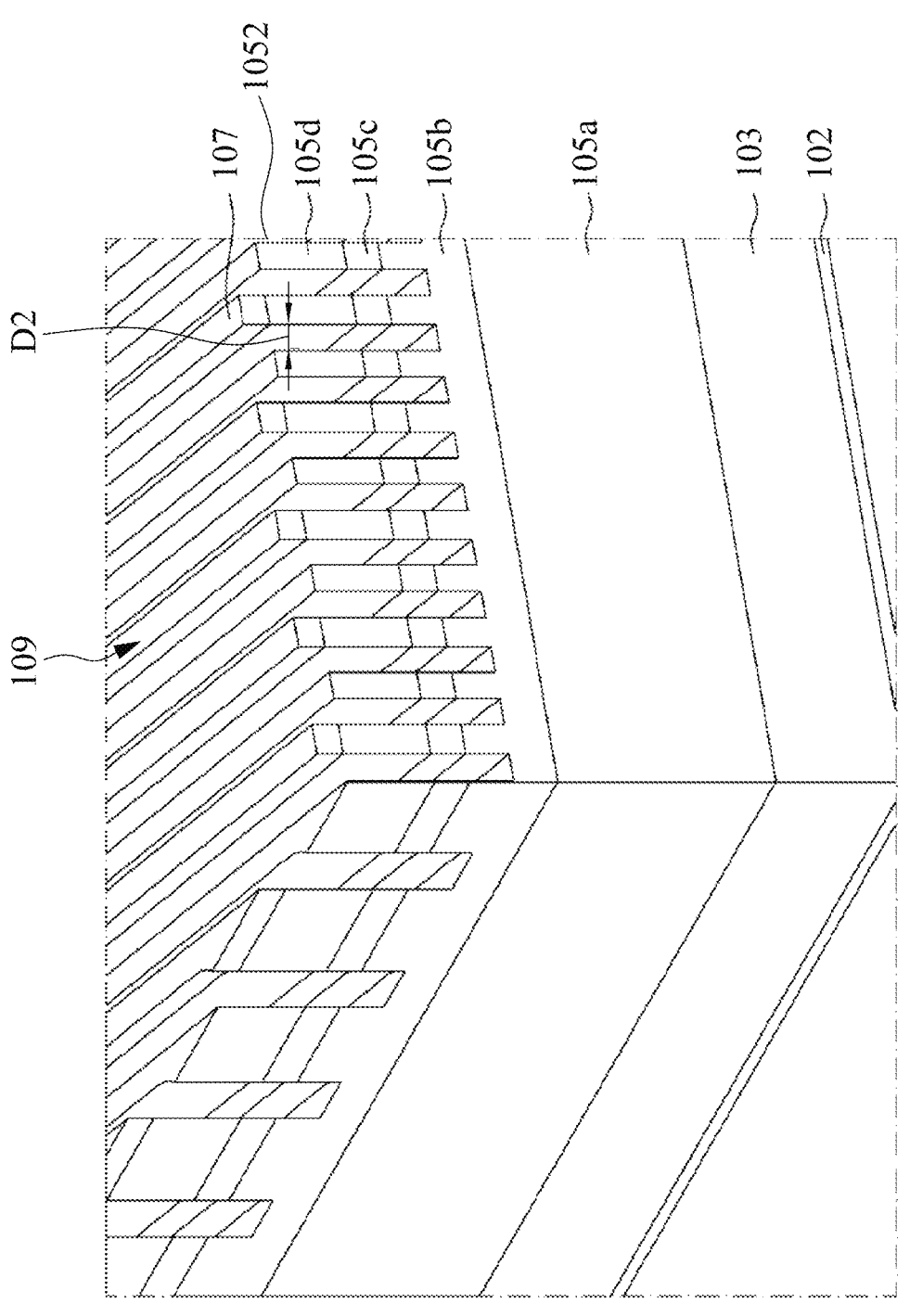
FIG. 8 is an enlarged view of a portion CC' of the semiconductor device as shown in FIG. 7.

Referring to FIG. 7 and FIG. 8 showing an enlarged view of a portion CC' in FIG. 7, portions of the etching stop layer 107 and portions of the fifth layer 105e are sequentially removed. In some embodiments, the underlayer 108 may be removed. In some embodiments, the portions of the etching stop layer 107 may be removed by an etching process P1. In some embodiments, the etching process P1 may include a dry etching process. In some embodiments, some portions of the etching stop layer 107 remains on the fourth layer 105d. In some embodiments, portions of the fourth layer 105d, portions of the third layer 105c and portions of the second layer 105b in the array region 101d are sequentially removed. As such, several strips 109 protruding from the second layer 105b are formed in the array region 101d. In some embodiments, a patterned fourth layer 1052 (or a patterned target layer) may be formed. The patterned fourth layer 1052 may have a pitch D2. In some embodiments, the pitch D1 may be different from the pitch D2. In some embodiments, the pitch D1 may be greater than the pitch D2.

Referring to FIG. 9, a seventh layer 110 may be formed over the fourth layer 105d and the etching stop layer 107. An eighth layer 111 may be then formed over the seventh layer 110. In some embodiments, the seventh layer 110 may fill gaps between the strips 109. In some embodiments, the seventh layer 110 may include carbon or other suitable materials. In some embodiments, the seventh layer 110 may be a sacrificial layer. In some embodiments, the seventh layer 110 may be formed using a CVD process or any other suitable process. In some embodiments, after the deposition of the seventh layer 110, a polish process may be performed to obtain a flat surface.

In some embodiments, the eighth layer 111 may be formed on the seventh layer 110. In some embodiments, the eighth layer 111 may include dielectric material, such as nitride or oxynitride. In some embodiments, the eighth layer 111 may be an antireflective coating (ARC) layer. In some embodiments, the eighth layer 111 may be formed by a plasma-enhanced CVD (PECVD) process.

Referring to FIG. 10, a second photoresist 112 may be formed over the eighth layer 111. In some embodiments, the second photoresist 112 includes a first portion 112a and several second portions 112b. In some embodiments, the second photoresist 112 may be patterned by removing portions of the second photoresist 112 to form the first portion 112a and the second portions 112b. In some embodiments, the second photoresist 112 may be patterned by photolithography, etching or any other suitable process. In some embodiments, the first portion 112a may be formed within the array region 101d. In some embodiments, the second portions 112b may be formed within the peripheral region 101c.

After the disposing of the second photoresist 112 over the eighth layer 111, several removal steps are performed. FIG. 11 to FIG. 17 are enlarged views of a portion DD' in FIG. 10 and illustrate the removal steps performed at the portion DD'.

Referring to FIG. 11, the first portion 112a of the second photoresist 112 may cover the eighth layer 111.

Referring to FIG. 12, portions of the eighth layer 111 and portions of the seventh layer 110 exposed through the first portion 112a of the second photoresist 112 are removed. In some embodiments, several openings 110a are formed. The opening 110a may penetrate the seventh layer 110. In some embodiments, the upper surface of the etching stop layer 107 may be exposed by the opening 110a. In some embodiments, the remaining portion of the eighth layer 111 may be removed after the formation of the openings 110a.

In some embodiments, the eighth layer 111 may be removed by dry etching or any other suitable process. In some embodiments, the second photoresist 112 may be removed by an ashing process, a wet strip process or any other suitable process. In some embodiments, the second photoresist 112 may be chemically altered so that it no longer adheres to the remaining portion of the eighth layer 111. In some embodiments, the remaining portion of the eighth layer 111 may be then removed to expose the remaining portion of the seventh layer 110.

Referring to FIG. 13, the remaining portion of the seventh layer 110 may be removed and the strips 109 may be exposed. In some embodiments, the etching stop layer 107 may be exposed. In some embodiments, the fourth layer 105d may be exposed. In some embodiments, the remaining portion of the seventh layer 110 may be removed by dry etching or any other suitable process.

Referring to FIG. 14, portions of the second layer 105b may further removed. In some embodiments, the portions of the second layer 105b may be removed by dry etching or any other suitable process. In some embodiments, several portions of the second layer 105b may remain and be isolated from each other. In some embodiments, after the further removal of the portions of the second layer 105b, the etching stop layer 107, the fourth layer 105d and the third layer 105c are also removed. In some embodiments, a portion of an upper surface of the first layer 105a may be exposed.

Referring to FIG. 15, portions of the first layer 105a exposed through the remaining portion of the second layer 105b may be removed. In some embodiments, the portions of the first layer 105a may be removed by dry etching or any other suitable process. In some embodiments, several portions of the first layer 105a may remain and be isolated from each other. In some embodiments, the remaining portions of the second layer 105b are removed after the removal of the portions of the first layer 105a.

Referring to FIG. 16, portions of the capping layer 103 and portions of the insulating layer 102 exposed through the remaining portions of the first layer 105a may be removed. In some embodiments, the portions of the capping layer 103 and the portions of the insulating layer 102 may be removed simultaneously, sequentially or separately. In some embodiments, the portions of the capping layer 103 may be removed, and then the portions of the insulating layer 102 may be removed. In some embodiments, the portions of the capping layer 103 may be removed by dry etching or any other suitable process. In some embodiments, the portions of the insulating layer 102 may be removed by dry etching or any other suitable process.

Referring to FIG. 17, portions of the substrate 101 exposed through the remaining portions of the insulating layer 102, the remaining portions of the capping layer 103 and the remaining portions of the first layer 105a may be removed to form several fins 101f protruding from the substrate 101. In some embodiments, the portions of the substrate 101 may be removed by dry etching or any other suitable process. In some embodiments, the fins 101f may be separated from each other.

Referring to FIG. 18, elongated member 101h and a plurality of blocks 101i may be formed. In some embodiments, the elongated member 101h may surround the fins 101f. The several block 101i may be formed in the peripheral region 101c. In some embodiments, the fins 101f, the elongated member 101h and the blocks 101i may protrude from an upper surface of the substrate 101. In some embodiments, the fins 101f, the elongated member 101h and the blocks 101i may be integrally formed.

In some embodiments, the fins 101f may be arranged in an array or matrix. In some embodiments, heights of the fins 101f may be consistent with each other. In some embodiments, the height of the fin 101f may range from about 30 nm to about 200 nm. In some embodiments, a pitch between adjacent pairs of fins 101f may be consistent. In some embodiments, the fin 101f may have a cylindrical shape. In some embodiments, a cross section of the fin 101f may have a circular, oval, quadrilateral or polygonal shape.

In some embodiments, the elongated member 101h may partially or entirely surrounds the fins 101f. In some embodiments, the elongated member 101h encircles the fins 101f. In some embodiments, the elongated member 101h may be at least partially disposed between two of the fins 101f.

In some embodiments, the elongated member 101h may have a width ranging from about 100 nm to about 800 nm. In some embodiments, a distance between the elongated member 101h and the outermost fin among the fins 101f may be in a range between 50 nm and 500 nm. In some embodiments, a top cross section of the elongated member 101h may be in a strip, frame or ring configuration. In some embodiments, the height of the fins 101f may be substantially same as a height of the elongated member 101h.

In some embodiments, the blocks 101i may protrude from the substrate 101 and are disposed in the peripheral region 101c. In some embodiments, the blocks 101i at least partially surround the array region 101d. In some embodiments, a cross section of the block 101 may have a quadrilateral or polygonal shape. In some embodiments, a width of the block 101i may be substantially greater than the width of the fin 101f. In some embodiments, the height of the block 101i may be substantially the same as the height of the fin 101f.

FIG. 19 is a flowchart of a method 2 of manufacturing a semiconductor device, in accordance with some embodiments of the present disclosure.

In some embodiments, the method 2 may begin with operation S21 in which a substrate is disposed into a semiconductor manufacturing tool.

In some embodiments, the method 2 may continue with operation S22 in which an underlayer is coated over the substrate.

In some embodiments, the method 2 may continue with operation S23 which involves obtaining a defect distribution map of defects on the underlayer.

In some embodiments, the method 2 may continue with operation S24 which involves, in response to the defect distribution map of the defects, adjusting a process condition of forming the underlayer.

The method 2 is merely an example, and is not intended to limit the present disclosure beyond what is explicitly recited in the claims. Additional operations can be provided before, during, or after each operation of the method 2, and some operations described can be replaced, eliminated, or reordered for additional embodiments of the method. In some embodiments, the method 2 can include further operations not depicted in FIG. 19. In some embodiments, the method 19 can include one or more operations depicted in FIG. 19.

FIG. 20 is a plot illustrating a defect distribution map 200 of defects. More specifically, the defect distribution map 200 is measured after an underlayer (e.g., 108 of FIG. 6) is formed over a substrate, which may correspond to stages as shown in FIG. 6. After the underlayer is formed on an etching stop layer (e.g., 107 of FIG. 6), defects 201 may be generated on or within the underlayer.

The defect distribution map 200 may be classified into a first defect distribution area 210 and a second defect distribution area 220. The density of defects of the first defect distribution area 210 may be greater than the density of defects of the second defect distribution area 220. In some embodiments, the classification of the first defect distribution area 210 and the second defect distribution area 220 may be utilized to adjust a process condition of an etching process (e.g., P1 of FIG. 7) and/or forming an underlayer. The adjustment of the etching process or of forming an underlayer is configured to reduce defects generated on or within the underlayer. In some embodiments, the defect distribution map 200 may be free of the first defect distribution area 210.

In some embodiments, the first defect distribution area 210 may include at least one cluster defect. For example, the first defect distribution area 210 may include 1 cluster defect, 5 cluster defects, 10 cluster defects, 50 cluster defect, 100 cluster defect, or more. The cluster defects in the second defect distribution area 220 are fewer than in the first defect distribution area 210. In some embodiments, the first defect distribution area 210 may be defined as a region wherein the density of cluster defects is greater than a predetermined value.

In some embodiments, adjusting a process condition of an etching process, which is utilized to remove or pattern an underlayer and/or an etching stop layer, may include adjusting and/or optimizing the process temperature of the etching process.

In some embodiments, adjusting a process condition of an etching process, which is utilized to remove or pattern an underlayer and/or an etching stop layer, may include adjusting and/or optimizing a concentration or pressure of reaction gas(es) of the etching process.

In some embodiments, adjusting a process condition of forming an underlayer may include adjusting and/or optimizing a thickness of an underlayer.

In some embodiments, adjusting a process condition of forming an underlayer may include adjusting and/or optimizing a uniformity of a thickness of an underlayer.

FIGS. 21 to 23 illustrate one or more stages of an exemplary method for manufacturing a semiconductor device according to some embodiments of the present disclosure.

Referring to FIG. 21, a substrate 401 may be disposed into a semiconductor manufacturing tool 310. The semiconductor manufacturing tool 310 may include a supporter 311, a nozzle 312, and a shift means 313. It should be noted that the semiconductor manufacturing tool 310 may include other elements or parts therein. The semiconductor manufacturing tool 310 may be utilized to coat an underlayer, such as an ARC layer, over the substrate 401. In some embodiments, the semiconductor manufacturing tool 310 may be utilized to perform a reduced resist consumption (RRC) process. For example, the semiconductor manufacturing tool 310 may be utilized to form an underlayer (e.g., 108 of FIG. 6) over an etching stop layer (e.g., 107 of FIG. 6).

The supporter 311 may be utilized to support the substrate 401. The nozzle 312 may be signally connected to the shift means 313. The nozzle 312 may be utilized to spray material(s) over the substrate 401. The shift means 313 may be utilized to adjust a relative position between the nozzle 312 and the substrate 401.

Referring to FIG. 22, in response to the defect distribution map 200 of the defects 201, the relative position between the nozzle 312 and the substrate 401 may be adjusted to optimize the process condition of forming an underlayer in accordance with some embodiments of this disclosure. The defect distribution map 200 of the defects 201 may be obtained by a substrate on which a layer (e.g., an underlayer) has been formed. The substrate may be disposed into a defect inspection tool, and thus the defect distribution map 200 may be generated.

In some embodiments, when the defect distribution map 200 includes a first defect distribution area 210, the shift means 313 will shift the position of the nozzle 312. For example, when a density of cluster defects greater than a predetermined value is detected, the shift means 313 will shift the position of the nozzle 312. In some embodiments, adjusting a relative position between the nozzle 312 and the substrate 401 may include generating a horizontal shift X1 between the nozzle 312 and the substrate 401. In some embodiments, adjusting a relative position between the nozzle 312 and the substrate 401 may include generating a vertical shift Y1 between the nozzle 312 and the substrate 401. In some embodiments, the horizontal shift X1 and/or the vertical shift Y1 may depend on the location of the first defect distribution area 210. In some embodiments, the nozzle 312 may be shifted to being above a region corresponding to the second defect distribution area 220 of the defect distribution map 200. In some embodiments, the horizontal shift X1 may range from about 1 mm to about 10 mm, such as 1 mm, 3 mm, 5 mm, 7 mm, 9 mm, or 10 mm. In some embodiments, the vertical shift Y1 may range from about 1 mm to about 10 mm, such as 1 mm, 3 mm, 5 mm, 7 mm, 9 mm, or 10 mm.

Referring to FIG. 23, a layer 402 (e.g., an underlayer) may be coated over the substrate 401 after the relative position between the substrate 401 and the layer 402 is adjusted. In some embodiments, a process P2 may be performed to form the layer 402. In some embodiments, the process P2 may include coating, depositing, or other suitable processes.

FIG. 24 is a block diagram illustrating a semiconductor fabrication system 300, in accordance with some embodiments of the present disclosure.

The semiconductor fabrication system 300 can include semiconductor manufacturing tools 310 and 330, as well as a defect inspection tool 320. The semiconductor manufacturing tools 310 and 330 and the defect inspection tool 320 may be coupled with a controller 350 through a network 340.

The semiconductor manufacturing tool 310 may be used to form an underlayer, such as the underlayer 108 shown in FIG. 6. The defect inspection tool 320 may be utilized to detect defect(s) on or within the underlayer, and to generate a defect distribution map (e.g., 200 of FIG. 20). The semiconductor manufacturing tool 330 may be used to perform an etching process (e.g., P1 of FIG. 7) to remove the underlayer.

The network 340 may be the internet or an intranet implementing network protocols such as transmission control protocol (TCP). Through the network 340, semiconductor manufacturing tools 310 and 330, as well as a defect inspection tool 320 may download or upload work in progress (WIP) information regarding the wafer or the semiconductor manufacturing tool from or to the controller 350.

The controller 350 may include a processer, such as a central processing unit (CPU) to determine adjustment of the process condition performed by the semiconductor manufacturing tools 310 and/or 330 based on the defect inspection tool 320. In some embodiments, the controller 350 may be utilized to determine the thickness and/or the uniformity of thickness of a layer (e.g., an urnderlayer). For example, the controller 350 may determine a shift between a substrate and a nozzle of the semiconductor manufacturing tool 310. In some embodiments, the controller 350 may determine a horizontal shift and/or a vertical shift between the substrate and the nozzle. In some embodiments, the controller 350 may determine a process condition of the semiconductor manufacturing tool 330 to optimize the etching process.

Although FIG. 24 does not show any other semiconductor manufacturing tool before the semiconductor manufacturing tool 310, the exemplary embodiment is not intended to be limiting. In other exemplary embodiments, various kinds of semiconductor manufacturing tools can be scheduled before the semiconductor manufacturing tool 310, and can be used to perform various processes according to the design requirement.

In the exemplary embodiments, a substrate 401 is transferred to the semiconductor manufacturing tool 310 to start a sequence of different processes. The substrate 401 may be processed by various stages forming at least one layer of material. The exemplary embodiments are not intended to limit the progress of the substrate 401. In other exemplary embodiments, the substrate 401 may include various layers, or any stages between the beginning and the completion of a product, before the substrate 401 is transferred to the semiconductor manufacturing tool 310. In the exemplary embodiments, the substrate 401 may passes through the semiconductor manufacturing tool 310, defect inspection tool 320, and semiconductor manufacturing tool 330 in a sequential order.

FIG. 25 is a diagram illustrating hardware of a semiconductor fabrication system 500, in accordance with various aspects of the present disclosure.

The processes illustrated in FIGS. 21-23 may be implemented in the controller 350 or a computing system that organizes the fabrication of wafer by controlling every part or a portion of the fabrication equipment in the facility. FIG. 25 is a diagram illustrating hardware of a semiconductor fabrication system 500, in accordance with various aspects of the present disclosure. The system 500 includes one or more of a hardware processor 501 and a non-transitory computer readable storage medium 503 encoded with, i.e., storing, the program codes (i.e., a set of executable instructions.). The computer readable storage medium 503 may also be encoded with instructions for interfacing with fabrication equipment for producing the semiconductor device. The processor 501 is electrically coupled to the computer readable storage medium 503 via a bus 505. The processor 501 is also electrically coupled to an I/O interface 507 by the bus 505. A network interface 509 is also electrically connected to the processor 501 via the bus 505. The network interface is connected to a network, so that the processor 501 and the computer readable storage medium 503 are capable of connecting to external elements via network 340. The processor 501 is configured to execute the computer program code encoded in the computer readable storage medium 505 in order to cause the system 500 to be usable for performing a portion or all of the operations as described in the methods illustrated in FIGS. 21-23.

In some exemplary embodiments, the processor 501 can be, but is not limited to, a central processing unit (CPU), a multi-processor, a distributed processing system, an application specific integrated circuit (ASIC), and/or a suitable processing unit. Various circuits or units are within the contemplated scope of the present disclosure.

In some exemplary embodiments, the computer readable storage medium 503 can be, but is not limited to, an electronic, magnetic, optical, electromagnetic, infrared, and/or a semiconductor system (or apparatus or device). For example, the computer readable storage medium 503 includes a semiconductor or solid-state memory, a magnetic tape, a removable computer diskette, a random access memory (RAM), a read-only memory (ROM), a rigid magnetic disk, and/or an optical disk. In one or more exemplary embodiments using optical disks, the computer readable storage medium 503 also includes a compact disk-read only memory (CD-ROM), a compact disk-read/write (CD-R/W), and/or a digital video disc (DVD).

In some exemplary embodiments, the storage medium 503 stores the computer program code configured to cause system 500 to perform methods illustrated in FIGS. 21-23. In one or more exemplary embodiments, the storage medium 501 also stores information needed for performing the methods illustrated in FIGS. 21-23 as well as information generated during performing the methods and/or a set of executable instructions to perform the operation of methods illustrated in FIGS. 21-23. In some exemplary embodiments, a user interface 51, e.g., a graphical user interface (GUI), may be provided for a user to operate on the system 500.

In some exemplary embodiments, the storage medium 503 stores instructions for interfacing with external machines. The instructions enable processor 501 to generate instructions readable by the external machines to effectively implement the methods illustrated in FIGS. 21-23 during an analysis.

System 500 includes input and output (I/O) interface 507. The I/O interface 507 is coupled to external circuitry. In some exemplary embodiments, the I/O interface 507 can include, but is not limited to, a keyboard, keypad, mouse, trackball, track-pad, touch screen, and/or cursor direction keys for communicating information and commands to processor 501.

In some exemplary embodiments, the I/O interface 507 can include a display, such as a cathode ray tube (CRT), liquid crystal display (LCD), a speaker, and so on. For example, the display shows in formation.

System 500 can also include a network interface 509 coupled to the processor 501. The network interface 509 allows system 500 to communicate with network 340, to which one or more other computer systems are connected.

Another aspect of the present disclosure provides a method of manufacturing a semiconductor device. The method includes providing a substrate. The method also includes forming a target layer over the substrate. The method further includes forming a patterned mask structure over the target layer. In addition, the method includes forming an etching stop layer over the patterned mask structure. The method also includes forming an underlayer over the etching stop layer. The method further includes obtaining a defect distribution map of defects on the underlayer. In response to the defect distribution map of the defects, adjusting a process condition of forming the underlayer.

Another aspect of the present disclosure provides a method of manufacturing a semiconductor device. The method includes providing a substrate. The method also includes forming an underlayer over the substrate. The method further includes obtaining a defect distribution map of defects on the underlayer. Forming the underlayer includes disposing the substrate in a semiconductor manufacturing tool and forming the underlayer includes determining a relative position of the nozzle and the substrate based on the defect distribution map of defects on the underlayer.

The embodiments of the present disclosure provide a method of manufacturing a semiconductor device. The method includes forming an underlayer over a substrate. The method includes obtaining a defect distribution map of defects on or within the underlayer. When a density of defects within a unit area exceeding a predetermined value is detected, a process condition of an etching process or forming the underlayer may be adjusted. As a result, the defects on or within the underlayer may be reduced, and electrical short within the array region may be prevented.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:

providing a substrate;

forming an underlayer over the substrate; and obtaining a defect distribution map of defects on the underlayer, wherein forming the underlayer comprises:

disposing the substrate in a semiconductor manufacturing tool including a nozzle; and determining a relative position of the nozzle of the semiconductor manufacturing tool and the substrate and a shift between the nozzle of the semiconductor manufacturing tool and the substrate based on the defect distribution map of defects on the underlayer.

2. The method of claim 1, further comprising:

obtaining a first defect distribution area and a second defect distribution area of the defect distribution map, wherein a first defect density of the first defect distribution area is greater than a second defect density of the second defect distribution area; and determining the relative position of the nozzle and the substrate based on the first defect distribution area and the second defect distribution area of the defect distribution map.

3. The method of claim 1, wherein the underlayer comprises an anti-reflective coating layer.

4. The method of claim 1, wherein the etching process comprises a dry etching process.

5. The method of claim 1, further comprising:

forming a target layer over the substrate;

forming a patterned mask structure over the target layer;

forming an etching stop layer over the patterned mask structure, wherein the underlayer is formed over the etching stop layer; and performing an etching process to pattern the target layer.

6. The method of claim 1, further comprising:

removing the underlayer;

removing the patterned mask structure;

removing a first portion of the etching stop layer; and removing a portion of the target layer to form a patterned target layer.

7. The method of claim 5, wherein the substrate comprises an array region and a peripheral region, and the patterned mask structure is formed over the array region of the substrate.

8. The method of claim 7, wherein the underlayer covers the array region and the peripheral region of the substrate.

9. The method of claim 6, wherein a portion of the etching stop layer remains on the target layer.

10. The method of claim 6, wherein a first pitch of the patterned target layer is different from a second pitch of the patterned mask structure.

* * * * *